(12) United States Patent
Das et al.

(10) Patent No.: US 7,791,897 B2
(45) Date of Patent: Sep. 7, 2010

(54) MULTI-LAYER EMBEDDED CAPACITANCE AND RESISTANCE SUBSTRATE CORE

(75) Inventors: Rabindra N. Das, Vestal, NY (US); John M. Lauffer, Waverly, NY (US); Irving Memis, Vestal, NY (US); Steven G. Rosser, Apalachin, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 12/283,146

(22) Filed: Sep. 9, 2008

(65) Prior Publication Data

US 2010/0060381 A1 Mar. 11, 2010

(51) Int. Cl.
*H05K 1/16* (2006.01)

(52) U.S. Cl. ............... 361/766; 361/302; 361/761; 361/762; 361/763; 361/790; 174/255; 174/260; 174/262; 257/350; 438/106; 438/687

(58) Field of Classification Search ........... 361/766, 361/302, 761–763, 793; 174/260, 262, 255; 257/350; 438/106, 687
See application file for complete search history.

(56) References Cited

U.S. PATENT DOCUMENTS

| | | | |
|---|---|---|---|
| 4,123,346 A * | 10/1978 | Ploix .................... 359/271 |
| 5,079,069 A | 1/1992 | Howard et al. |
| 5,162,977 A | 11/1992 | Paurus et al. |
| 5,270,493 A * | 12/1993 | Inoue et al. ............. 174/253 |
| 5,973,929 A * | 10/1999 | Arakawa et al. .......... 361/762 |
| 6,040,226 A * | 3/2000 | Wojnarowski et al. ...... 438/381 |
| 6,068,782 A | 5/2000 | Brandt et al. |
| 6,395,996 B1 | 5/2002 | Tsai et al. |
| 6,500,350 B1 * | 12/2002 | Hunt et al. .............. 216/16 |
| 6,541,137 B1 * | 4/2003 | Kingon et al. ............ 428/701 |
| 6,544,651 B2 | 4/2003 | Wong et al. |
| 6,616,794 B2 | 9/2003 | Hartman et al. |
| 6,690,123 B1 * | 2/2004 | Riddle et al. ............. 315/382 |
| 6,704,207 B2 | 3/2004 | Kopf |
| 6,818,469 B2 * | 11/2004 | Mori et al. .............. 438/52 |
| 6,841,080 B2 * | 1/2005 | Kingon et al. ............ 216/6 |
| 7,078,816 B2 | 7/2006 | Japp et al. |
| 7,235,745 B2 * | 6/2007 | Das et al. ............... 174/260 |
| 7,429,789 B2 * | 9/2008 | Japp et al. .............. 257/705 |
| 7,491,624 B2 * | 2/2009 | Lu et al. ................ 438/455 |
| 7,626,828 B1 * | 12/2009 | Alexander et al. ......... 361/763 |
| 2002/0085360 A1 * | 7/2002 | Doi ..................... 361/782 |
| 2003/0016118 A1 * | 1/2003 | Schemenaur et al. ....... 338/309 |
| 2006/0006504 A1 * | 1/2006 | Lee et al. ............... 257/666 |
| 2006/0151863 A1 | 7/2006 | Das et al. |
| 2006/0154434 A1 * | 7/2006 | Das et al. ............... 438/393 |
| 2006/0154501 A1 | 7/2006 | Das et al. |
| 2006/0170520 A1 * | 8/2006 | Ha et al. ................ 333/187 |
| 2006/0185140 A1 * | 8/2006 | Andresakis et al. ........ 29/25.41 |
| 2006/0188701 A1 * | 8/2006 | Andresakis et al. ........ 428/209 |
| 2007/0010064 A1 | 1/2007 | Das et al. |
| 2007/0010065 A1 * | 1/2007 | Das et al. ............... 438/393 |

(Continued)

*Primary Examiner*—Xiaoliang Chen
(74) *Attorney, Agent, or Firm*—Hinman, Howard & Kattell; Mark Levy

(57) ABSTRACT

A multi-layer imbedded capacitance and resistance substrate core. At least one layer of resistance material is provided. The layer of resistance material has a layer of electrically conductive material embedded therein. At least one layer of capacitance material of high dielectric constant is disposed on the layer of resistance material. Thru-holes are formed by laser.

14 Claims, 14 Drawing Sheets

U.S. PATENT DOCUMENTS

| | | |
|---|---|---|
| 2007/0059922 A1* | 3/2007 | Clevenger et al. ........... 438/637 |
| 2007/0177331 A1 | 8/2007 | Das et al. |
| 2007/0275525 A1 | 11/2007 | Das et al. |
| 2008/0087459 A1* | 4/2008 | Das et al. .................... 174/260 |
| 2008/0093113 A1* | 4/2008 | Jow et al. .................... 174/260 |
| 2008/0151515 A1* | 6/2008 | Das et al. .................... 361/761 |
| 2008/0212304 A1* | 9/2008 | Masuda et al. .............. 361/818 |
| 2008/0238568 A1* | 10/2008 | Davies-venn et al. ......... 333/25 |
| 2008/0264677 A1* | 10/2008 | Hsu ........................... 174/250 |

* cited by examiner ern and Method of Making an Information Handling System Including Said Circuitized Substrate, and U.S. Published Patent Application No. 2007/0177331 upon application filed Apr. 4, 2007 for NON-FLAKING CAPACITOR MATERIAL, CAPACITIVE SUBSTRATE HAVING AN INTERNAL CAPACITOR THEREIN INCLUDING SAID NON-FLAKING CAPACITOR MATERIAL, AND METHOD OF MAKING A CAPACITOR MEMBER FOR USE IN A CAPACITIVE SUBSTRATE.

MULTI-LAYER EMBEDDED CAPACITANCE AND RESISTANCE SUBSTRATE CORE

RELATED PATENT APPLICATIONS

The present patent application is related to U.S. Published Patent Application No. 2007/0010064 upon application filed Feb. 13, 2006 for METHOD OF MAKING A CAPACITIVE SUBSTRATE USING PHOTOIMAGEABLE DIELECTRIC FOR USE AS PART OF A LARGER CIRCUITIZED SUBSTRATE, METHOD OF MAKING SAID CIRCUITIZED SUBSTRATE AND METHOD OF MAKING AN INFORMATION HANDLING SYSTEM INCLUDING SAID CIRCUITIZED SUBSTRATE, and U.S. Published Patent Application No. 2007/0177331 upon application filed Apr. 4, 2007 for NON-FLAKING CAPACITOR MATERIAL, CAPACITIVE SUBSTRATE HAVING AN INTERNAL CAPACITOR THEREIN INCLUDING SAID NON-FLAKING CAPACITOR MATERIAL, AND METHOD OF MAKING A CAPACITOR MEMBER FOR USE IN A CAPACITIVE SUBSTRATE.

FIELD OF THE INVENTION

The present invention relates to printed circuit board substrates and, more particularly, to a printed circuit board substrate having an embedded capacitance and resistance core.

BACKGROUND OF THE INVENTION

Circuitized substrates such as printed circuit boards (hereinafter also referred to as PCBs), chip carriers, and the like are typically constructed in laminate form in which several layers of dielectric material and conductive material (laminates) are bonded together using relatively high temperature and pressure lamination processes. The conductive layers, typically of thin copper, are usually used in the formed substrate for providing electrical connections to and among various devices located on the surface of the substrate, examples of such devices being integrated circuits (semiconductor chips) and discrete passive devices, such as capacitors, resistors, inductors, and the like. The discrete passive devices occupy a high percentage of the surface area of the completed substrate, which is undesirable because of the increased demand for miniaturization of products. In order to increase the available substrate surface area, multiple functions can be provided on a single component for mounting on a board. When passive devices are in such a configuration, these are often referred to as integral passive devices, meaning that the functions are integrated into the singular component. Because of such external positioning, however, these components still utilize, albeit less than if in singular form, valuable board real estate. In response, there have also been efforts to embed discrete passive components within the board.

A capacitor designed for disposition within a PCB substrate may thus be referred to as an embedded integral passive component or, more simply, an embedded capacitor. Such a capacitor thus provides internal capacitance. The result of this internal positioning is that it is unnecessary to also position such devices externally on the PCB's outer surface(s).

With respect to a fixed capacitor area, two known approaches are available for increasing the planar capacitance (capacitance/area) of an internal capacitor. In one such approach, higher dielectric constant materials can be used, while in a second, the thickness of the dielectric can be reduced. These constraints are reflected in the following formula for capacitance per area:

$C/A$=Dielectric Constant of Laminate $X$ Dielectric Constant in Vacuum/Dielectric Thickness where: $C$ is the capacitance and $A$ is the area of the capacitor.

As mentioned above, there have been attempts to provide internal capacitance and other internal conductive structures, components or devices within circuitized substrates such as PCBs, some of these including the use of nano-powders. The following are some examples of such attempts, including those using nano-powders and those using alternative measures.

U.S. Pat. No. 6,704,207, entitled "Device and Method for Interstitial Components in a Printed Circuit Board," issued Mar. 9, 2004, discloses a printed circuit board which includes a first layer having first and second surfaces, with an above-board device (e.g., an ASIC chip) mounted thereon. The PCB includes a second layer having third and fourth surfaces. One of the surfaces can include a recessed portion for securely holding an interstitial component. A "via," electrically connecting the PCB layers, is also coupled to a lead of the interstitial component. The interstitial components include diodes, transistors, resistors, capacitors, thermocouples, and the like.

U.S. Pat. No. 6,616,794, entitled "Integral Capacitance for Printed Circuit Board Using Dielectric Nanopowders" and issued Sep. 9, 2003, discloses a method for producing integral capacitance components for inclusion within printed circuit boards in which hydro-thermally prepared nano-powders permit the fabrication of dielectric layers that offer increased dielectric constants and are readily penetrated by micro-vias. A slurry or suspension of a hydro-thermally prepared nano-powder and solvent is prepared. A suitable bonding material, such as a polymer, is mixed with the nano-powder slurry to generate a composite mixture which is formed into a dielectric layer. The dielectric layer may be placed upon a conductive layer prior to curing, or conductive layers may be applied upon a cured dielectric layer, either by lamination or metallization processes, such as vapor deposition or sputtering.

U.S. Pat. No. 6,544,651, entitled "High Dielectric Constant Nano-Structure Polymer-Ceramic Composite" and issued Apr. 3, 2003, discloses a polymer-ceramic composite having high dielectric constants formed using polymers containing a metal acetylacetonate (acacs) curing catalyst. In particular, a certain percentage of Co (III) may increase the dielectric constant of a certain epoxy. The high dielectric polymers are combined with fillers, preferably ceramic fillers, to form two-phase composites having high dielectric constants.

U.S. Pat. No. 6,395,996, entitled "Multi-layered Substrate With Built-In Capacitor Design" and issued May 28, 2002, discloses a multi-layered substrate having built-in capacitors which are used to decouple high frequency noise generated by voltage fluctuations between a power plane and a ground plane of a multi-layered substrate. At least one kind of dielectric material, which has filled-in through holes between the power plane and the ground plane and includes a high dielectric constant, is used to form the built-in capacitors.

U.S. Pat. No. 6,068,782, entitled "Individual Embedded Capacitors for Laminated Printed Circuit Boards" and issued May 30, 2000, discloses a method of fabricating individual, embedded capacitors in multi-layer printed circuit boards. The capacitor fabrication is based on a sequential build-up technology employing a first pattern-able insulator. After patterning of the insulator, pattern grooves are filled with a high dielectric constant material, typically a polymer/ceramic composite. Capacitance values are defined by the pattern size, thickness and dielectric constant of the composite. Capacitor electrodes and other electrical circuitry can be created either by etching laminated copper, by metal evaporation, or by depositing conductive ink.

U.S. Pat. No. 5,162,977, entitled "Printed Circuit Board Having an Integrated Decoupling Capacitive Element" and issued Nov. 10, 1992, discloses a PCB which includes a high capacitance power distribution core, the manufacture of which is compatible with standard printed circuit board assembly technology. The high capacitance core consists of a ground plane and a power plane separated by a planar element having a high dielectric constant. The high dielectric constant material is typically glass fiber impregnated with a bonding material, such as epoxy resin loaded with a ferro-electric ceramic substance having a high dielectric constant. The ferro-electric ceramic substance is typically a nano-powder combined with an epoxy bonding material. Pre-fired and ground ceramic nano-powder particles have a typical dimension in the range of 500-20,000 nanometers. Furthermore, the particle distribution in this range is generally rather broad, meaning that there could be a 10,000 nm particle alongside a 500 nm particle.

The distribution within the dielectric layer of particles of different size often presents major obstacles to thru-hole formation where the thru-holes are of extremely small diameter, also referred to in the industry as micro-vias, due to the presence of the larger particles. Another problem associated with pre-fired ceramic nano-powders is the ability for the dielectric layer to withstand substantial voltage without breakdown occurring across the layer. Typically, capacitance layers within a PCB are expected to withstand at least 300 volts in order to qualify as a reliable component for PCB construction. The presence of the comparatively larger ceramic particles in pre-fired ceramic nano-powders within a capacitance layer prevents extremely thin layers from being used because the boundaries of contiguous large particles provide a path for voltage breakdown. This is even further undesirable because, as indicated by the equation cited above, greater planar capacitance may also be achieved by reducing the thickness of the dielectric layer. The thickness is thus limited by the size of the particles therein.

U.S. Pat. No. 5,079,069, entitled "Capacitor Laminate for Use in Capacitive Printed Circuit Boards and Methods of Manufacture" and issued Jan. 7, 1992, discloses a capacitor laminate to provide a bypass capacitive function for devices mounted on the PCB, the capacitor laminate being formed of conventional conductive and dielectric layers whereby each individual external device is provided with capacitance by a proportional portion of the capacitor laminate and by borrowed capacitance from other portions of the capacitor laminate, the capacitive function of the capacitor laminate being dependent upon random firing or operation of the devices. That is, the resulting PCB still requires the utilization of external devices thereon, and thus does not afford the PCB external surface area real estate savings mentioned above.

U.S. Pat. No. 7,078,816 for "Circuitized Substrate", issued Jul. 18, 2006 to Robert Japp et al teaches a circuitized substrate comprising a first layer comprising a dielectric material including a resin material including a predetermined quantity of particles therein and not including continuous fibers, semi-continuous fibers or the like as part thereof, and at least one circuitized layer positioned on the dielectric first layer.

U.S. Pat. Publication No. 2006/0151863 for "Capacitor Material for Use in Circuitized Substrates, Circuitized Substrate Utilizing Same, Method of Making Said Circuitized Substrate, and Information Handling System Utilizing Said Circuitized Substrate", on application filed Jul. 13, 2006 by Rabindra N. Das et al teaches a material for use as part of an internal capacitor within a circuitized substrate including a polymer (e.g., a cycloaliphatic epoxy or phenoxy based) resin and a quantity of nano-powders of ferroelectric ceramic material (e.g., barium titanate).

U.S. Pat. Publication No. 2006/0154434 for "Method of Making an Internal Capacitive Substrate for Use in a Circuitized Substrate And Method of Making Said Circuitized Substrate", on application filed Jul. 13, 2006 by Rabindra N. Das et al teaches a method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier.

U.S. Pat. Publication No. 2006/0154501 for "Capacitor Material With Metal Component for Use in Circuitized Substrates, Circuitized Substrate Utilizing Same, Method of Making Said Circuitized Substrate, and Information Handling System Utilizing Said Circuitized Substrate", on application filed Jul. 13, 2006 discloses a material for use as part of an internal capacitor within a circuitized substrate. A polymer resin and a quantity of nano-powders including a mixture of at least one metal component and at least one ferroelectric ceramic component are provided.

U.S. Pat. Publication No. 2007/0010064 for "Method of Making a Capacitive Substrate Using Photoimageable Dielectric For Use as Part of a Larger Circuitized Substrate, Method of Making Said Circuitized Substrate and Method of Making an Information Handling System Including Said Circuitized Substrate" on application filed by Rabindra N. Das et al teaches a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. Photoimageable material is used to facilitate positioning of the capacitive dielectric being printed. The capacitive substrate may be incorporated within a larger circuitized substrate to form an electrical assembly.

U.S. Patent Publication No. 2007/0010065 for "Method of Making a Capacitive Substrate For Use as Part of a Larger Circuitized Substrate, Method of Making Said Circuitized Substrate and Method of Making an Information Handling System Including Said Circuitized Substrate", on application filed Jan. 11, 2007 by Rabindra N. Das et al teaches a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate.

U.S. Pat. Publication No. 2007/0177331 for "Non-Flaking Capacitor Material, Capacitive Substrate Having an Internal Capacitor Therein Including Said Non-Flaking Capacitor Material, and Method of Making a Capacitor Member for Use in a Capacitive Substrate", on application filed Aug. 2, 2007 by Rabindra N. Das et al teaches a capacitor material including a thermosetting resin, a high molecular mass flexibilizer, and a quantity of nano-particles of a ferroelectric ceramic material, the capacitor material not including continuous or semi-continuous fibers as part thereof. The material is adapted for being positioned in layer form on a first conductor member and heated to a predetermined temperature whereupon the material will not possess any substantial flaking characteristics. A second conductor member may then be positioned on the material to form a capacitor member, which then may be incorporated within a substrate to form a capacitive substrate. Electrical components may be positioned on the substrate and capacitively coupled to the internal capacitor.

U.S. Pat. Publication No. 2007/0275525 for "Capacitive Substrate and Method of Making Same", on application filed Nov. 29, 2007 by Rabindra N. Das et al teaches a capacitive substrate and method of making same in which first and second glass layers are used. A first conductor is formed on a first of the glass layers and a capacitive dielectric material is positioned over the conductor. The second conductor is then positioned on the capacitive dielectric and the second glass layer positioned over the second conductor. Conductive thru-holes are formed to couple to the first and second conductors, respectively, such that the conductors and capacitive dielectric material form a capacitor when the capacitive substrate is in operation.

The teachings of the above patents and co-pending applications listed above are incorporated herein by reference.

With respect to commercially available dielectric powders which have been used in internal conductive structures such as mentioned in some of the above patents, among these being metal titanate-based powders, such powders are known to be produced by a high-temperature, solid-state reaction of a mixture of the appropriate stoichiometric amounts of oxides or oxide precursors (e.g., carbonates, hydroxides or nitrates) of barium, calcium, titanium, and the like. In such calcination processes, the reactants are wet-milled to accomplish a desired final mixture. The resulting slurry is dried and fired at elevated temperatures, sometimes as high as 1,300 degrees C., to attain the desired solid-state reactions. Thereafter, the fired product is milled to produce a powder. Although the pre-fired and ground dielectric formulations produced by solid phase reactions are acceptable for many electrical applications, these suffer from several disadvantages. First, the milling step serves as a source of contaminants, which can adversely affect electrical properties. Second, the milled product consists of irregularly shaped fractured aggregates which are often too large and possess a wide particle size distribution, 500-20,000 nm. Consequently, films produced using these powders are limited to thicknesses greater than the size of the largest particle. Third, powder suspensions or composites produced using pre-fired ground ceramic powders must be used immediately after dispersion, due to the high sedimentation rates associated with large particles. The stable crystalline phase of barium titanate for particles greater than 200 nm is tetragonal and, at elevated temperatures, a large increase in dielectric constant occurs due to a phase transition. It is thus clear that methods of making PCBs which rely on the advantageous features of using nano-powders as part of the PCB's internal components possess various undesirable aspects which are detrimental to providing a PCB with optimal functioning capabilities when it comes to internal capacitance or other electrical operation. This is particularly true when the desired final product attempts to meet today's miniaturization demands, including the utilization of high-density patterns of thru-holes therein.

The present invention represents an approach to forming internal capacitors and resistors in a substrate. In the present invention, at least two capacitors may be formed by initially forming a first capacitive substrate, positioning layers of photoimageable material atop the substrate and thereafter removing portions thereof to expose the capacitive substrate's conductors, then forming a quantity of capacitive material on the two exposed conductors. This process eliminates the need for providing an interim dielectric layer and is also capable of being performed using known technologies. Significantly, the capacitors formed using the teachings herein are capable of having nano and/or micro particles as part thereof. It is believed that such a method, as well as a method of forming a larger circuitized substrate including the capacitive substrate, represent significant advancements in the art.

SUMMARY OF THE INVENTION

In accordance with the present invention, there is provided a laser drillable, multi-layer embedded capacitance and resistance layers core substrate capable of providing bulk decoupling capacitance and resistance with low inductance and low parasitics. Multiple capacitance layers with variable capacitance density and multiple resistance layers with variable resistivity provide a wide range of capacitor and resistor values. multi-layer embedded capacitance and resistance substrate core. At least one layer of resistance material is provided. The layer of resistance material has a layer of electrically conductive material embedded therein. At least one layer of capacitance material of high dielectric constant is disposed on the layer of resistance material. This core substrate can further be circuitized to make a finished printed wiring board or chip carrier where multiple embedded capacitors with variable capacitance density and multiple embedded resistance layer with variable resistivity replace most of the surface mount capacitors and resistors. Thru-holes are formed by laser.

BRIEF DESCRIPTION OF THE DRAWINGS

A complete understanding of the present invention may be obtained by reference to the accompanying drawings, when considered in conjunction with the subsequent detailed description, in which.

For the sake of clarity and brevity, like elements and components of each embodiment will bear the same designations throughout the description.

DESCRIPTION OF THE PREFERRED EMBODIMENT

Figure 1:
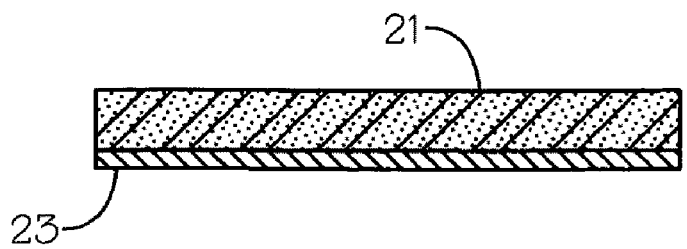
FIGS. 1 and 2 are side elevational views, in section and on an enlarged scale, illustrating the steps of making a capacitor member in accordance with one embodiment of the invention.

Generally speaking, the present invention features a multi-layer imbedded capacitance and resistance substrate core. At least one layer of resistance material is provided. The layer of resistance material has a layer of electrically conductive material embedded therein. At least one layer of capacitance material of high dielectric constant is disposed on the layer of resistance material. Thru-holes are formed by laser.

The invention incorporates a reinforced starting core that can be laser drilled with small holes and provides a reduced CTE (7 to 15 ppm/C). The structure has resistors in the middle and capacitors sequentially applied on the surface, allowing multiple capacitor layers in a thin total structure. The resin coated copper capacitive layer need not supply any structural support; it can be very thin and achieve high values of capacitance per unit area. Also, since it is not structural, the choices of material expand significantly. The structure with small vias allows the vias to thread through the legs of the serpentine resistors and significantly improves z-directional communication. This is especially important when there are multiple voltages supported by the capacitor layers. The structure with small vias allows the vias to thread through the legs of the serpentine resistors and significantly improves z-directional communication. This is especially important when there are multiple voltages supported by the capacitor layers. The overall approach lends itself to package miniaturization because capacitance can be increased through multiple layers and reduced thickness to obtain desired values in a smaller area. The many layers can be accessed because the laser drilled small holes (about 50 μm diameter) do not consume large amounts of area.

By the term "capacitive substrate" as used herein is meant a substrate including at least three capacitive dielectric layers and at least four conductors, which combine to form at least two capacitors. Such substrates, in the simplest form, are adapted for being used as a substrate having other electrical components electrically coupled thereto, e.g., to form an electrical assembly. In the preferred embodiments, however, the capacitive substrates as formed in accordance with the teachings herein are preferably incorporated within a larger substrate structure to form a circuitized substrate such that the capacitive substrate is an internal structure of the larger circuitized substrate. As defined, more than one of these capacitive substrates may be included within the larger circuitized substrate.

By the term "capacitor member" as used herein is meant a member comprising at least two conductor layers and an interim quantity of capacitor material, said capacitor member adapted for being positioned within and thus part of a capacitive substrate.

By the term "continuous" as used herein to define fibrous materials is meant a structure such as a woven cloth including lengthy fibers, including fibers which run the full distance through the structure.

By the term "semi-continuous" as used herein to define fibrous materials is meant structures with much shortened length fibers, which are also referred to as "chopped" fibers, one example being chopped fiber mats.

By the term "electrical assembly" is meant at least one circuitized substrate as defined herein in combination with at least one electrical component electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. A well-known assembly is the conventional printed circuit board (PCB) typically having several external components such as chip carriers, semiconductor chips, etc. mounted thereon and coupled to the internal circuitry of the PCB.

By the term "electrical component" as used herein is meant components such as semiconductor chips and the like which are adapted for being positioned on the external conductive surfaces of circuitized substrates and electrically coupled to the substrate for passing signals from the component into the substrate (including into the internal capacitive substrate) whereupon such signals may be passed on to other components, including those mounted also on the substrate, as well as other components such as those of a larger electrical system in which the substrate is positioned.

By the term "ferroelectric ceramic" as used herein is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

By the term "high molecular mass" as used herein to define the flexibilizers used in the capacitor material compositions herein is meant a molecular mass of at least 4,000 grams/mole.

By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Such systems typically include one or more PCBs, chip carriers, etc. as integral parts thereof. For example, a PCB typically used includes a plurality of various components such as chip carriers, capacitors, resistors, modules, etc. mounted thereon. One such PCB may be referred to as a "motherboard" while various other boards (or cards) may be mounted thereon using suitable electrical connectors.

By the term "ink jet printing" as used herein is meant conventional ink jet printing processes as used today to deposit inks onto designated targets. Equipment used for this purpose typically includes a plurality of print heads which direct the ink "spray" onto the targets.

By the term "nano-particles" is meant particles with a size of from about 0.01 micron (ten nanometers) to about one micron (1000 nanometers).

By the term "micro-particles" is meant particles having a size of from about one micron (1000 nanometers) to about five microns (5000 nanometers). The capacitive material powders used to form the screen-printed or ink jet printed capacitive dielectric layers herein are understood to include micro-particles and/or nano-particles.

By the term "screen printing" as used herein is meant both screen and stencil printing processes as conventionally used today. These involve the use of a screen or stencil through which a desired material (e.g., inks, conductive compositions, etc.) are deposited.

By the term "thru-hole" as used herein is meant what are commonly referred to in the industry as "blind vias" which are openings typically from one surface of a substrate to a predetermined distance therein, "internal vias" which are vias or openings located internally of the substrate and are typically formed within one or more internal layers prior to lamination thereof to other layers to form the ultimate structure, and "plated through holes" (also known as PTHS), which typically extend through the entire thickness of a substrate. All of these various openings form electrical paths through the substrate and often include one or more electrically conductive layers. Alternatively, such openings may simply include a quantity of conductive paste or, still further, the paste can be additional to plated metal on the opening sidewalls. These openings in the substrate are formed typically using mechanical drilling or laser ablation, following which the plating and/or conductive paste are be added.

In FIG. 1, a quantity of capacitor material 21 is positioned onto a first electrically conductive member (hereinafter also referred to simply as conductor) 23, to an initial thickness of from about 0.2 mils to about 5.0 mils. A preferred method of applying material 21 is in liquid form, using, for example, a curtain, roller or drawdown coating process. Such application is also preferably accomplished in a roll-to-roll format. Alternatively, it is also possible to deposit material 21 in paste form using a screen-printing operation or in ink form using a ink-jet printing operation. Material 21 comprises a thermosetting resin, a high molecular mass flexibilizer, and a quantity of nano-particles of a ferroelectric ceramic material. Significantly, the material forming the layer as shown is not applied onto a supporting web or like material such as Fiberglas mesh, and thus does not include continuous or semi-continuous fibers as part thereof. Equally significant, the coated material 21 may have a thickness of from about two to three microns, an extremely valuable characteristic when considering the microminiaturization demanded in many of today's electrical products such as substrates of the type defined herein. In one example, material 21 was coated to a thickness of only 2.5 microns.

A preferred thermosetting resin used for material 21 is an epoxy resin, and more preferably an epoxy novalac resin such as one sold under product designation "LZ 8213" by Huntsman, Salt Lake City, Utah. Other acceptable thermosetting resins usable herein include high temperature diglycidyl ether, polyimide, cyanate ester (triazines), bismaleimide, bismaleimide and epoxy modified blend, benzoxazine, epoxy modified benzoxazine, halogen free benzoxazine, fluoropolymer, benzocyclobutene, perfluorobutane, polyphenylenesulfide, polysulfone, polyetherimide, polyetherketone, polyphenylquinoxaline, polybenzoxazole, polyphenyl benzobisthiazole and combinations thereof. In general the epoxy resin may be selected from the group including the diglycidyl ethers of resorcinol, catechol, hydroquinone, biphenol, bisphenol A, tetrabromobisphenol A, phenolaldehyde novolac resins, alkyl substituted phenol-aldehyde resins, bisphenol F, tetramethylbiphenol, tetramethyltetrabromophenol, tetrachlorobisphenol A, and combinations thereof. The cyanate esters, if used, may be selected from the group consisting of cyanatobenzene, dicyanatobenzene, 1,3, 5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dichloro 4-cyanatophenyl)propane, 2,2-bis(3,5-diblomo 4-dicyanatophenyl)propane, bis(4-cyanatophenyl)ether, bis(4-cyanatophenyl)thioether, bis(4-cyanatophenyl)sulfone, tris(4-cyanatophenyl)-phosphite, tris(4-cyanatophenyl)phosphate, bis(3-chloro-4-cyanatophenyl)methane, cyanated novolak derived from novolak cyanated disphenol type polycarbonate oligomer derived from bisphenol type polycarbonate oligomers, and combinations thereof.

A preferred high molecular mass flexibilizer used in this composition is phenoxy resin and, in particular, one sold under the product name "PKHS40" by the InChem Corporation, having a business location at Rock Hill, S.C. Other high molecular mass flexibilizers include oligomeric resin and polymeric resin. When used, the phenoxy resin comprises from about five to twenty percent by weight of the capacitor material 21.

A preferred ferroelectric ceramic material used herein is barium titanate ($BaTiO_3$) powder available from Cabot Corporation under the product designation "BT-8", Cabot Corporation having a business location in Boyertown, Pa. An alternative $BaTiO_3$ powder is also available from the Nippon Chemical Industrial Co., Ltd., of Tokyo, Japan. Other such ceramics include substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof. Of importance, it has been determined that material 21 should include less than about eighty percent (by weight) of barium titanate in the material's final form (following heating), with more detailed examples below. Such a percentage is deemed important to assure non-flaking of the material following heating to remove the solvent carrier and partially advance the thermosetting resin thereof as defined below. The particles of the ferroelectric ceramic are nano-particles, having the dimensions cited above.

A preferred first conductor member 23 is a copper or copper alloy foil, having a thickness of from about 0.1 mils to about 4.0 mils and, in the example above where material 21 is of a 2.5 micron thickness, is preferably 1.0 mil thick.

Following deposition, the capacitor material 21 (and conductor 15) is/are heated to a temperature within the range of from about 120 degrees C. to about 140 degrees C. for about two minutes to about four minutes. In one example, with a 2.5 micron material thickness, the material 21 and conductor 15 were heated to 130 degrees C. for approximately three minutes. This is preferably accomplished by placing the FIG. 1 structure within a suitable convection oven. Such heating, in addition to driving off, residual organic solvents from the composition, also serves to at least partly cure the capacitor material. Most significantly, heating this size structure as defined has proven to substantially eliminate the possibility of the capacitor material from flaking, the deleterious results of such flaking being cited above.

Once the structure of FIG. 1 has cooled from the above heating, a second conductor member 25 is then applied atop the capacitor material 21. Member 25 is preferably of the same material and thickness as member 23. This layered member 25, also a solid sheet of copper or copper alloy, is preferably bonded to the formed layer of capacitor material 21 using conventional PCB lamination processing. Alternatively, layered member 25 may be formed atop material 21 using conventional sputtering processing. During such sputtering, a thin layer of the copper metal is vacuum deposited onto material 21. Such sputtering may also include depositing a barrier metal layer prior to the copper layer, such a barrier layer typically comprised of chrome or titanium with a thickness of 50 Angstroms to about 500 Angstroms. The sputtered copper layer may then be used as a seed layer for a subsequent electroplating of a copper layer, if desired. Other methods may be used for depositing the copper or copper alloy layer 25, and the invention is not limited to those described above. The lamination procedure, if used and at a sufficiently high temperature and pressure, will serve to further cure the capacitor material from the partly cured state following the oven heating described above.

The three-layered structure of FIG. 2, in its simplest form as shown, is now capable of serving as a capacitor 27 within a capacitive substrate (below). The invention is not limited to said form, however, as it is often desirable to further process the FIG. 2 structure, including for example, to "personalize" each of the conductor layers 23 and 25. Such "personalizing" is known in the PCB art and typically includes use of photolithographic processing in which a photoresist is applied to the metal conductors, exposed and developed, following which etching of selected, unprotected portions of the conductor layers occurs. The result is a pattern of individual conductors, including possibly lines and/or pads. Selected ones of said lines and/or pads may then serve as the electrodes for the internal capacitor. Thus it is possible for each of the conductor layers 23 and 25 (FIG. 2) to include several individual pads or lines which each serve as a capacitor electrode for a corresponding electrode on the opposite conductor. The conductors as shown in FIG. 2 and FIG. 4 are thus shown in singular form for ease of explanation, it being understood that additional possible combinations are readily possible.

Figure 3:
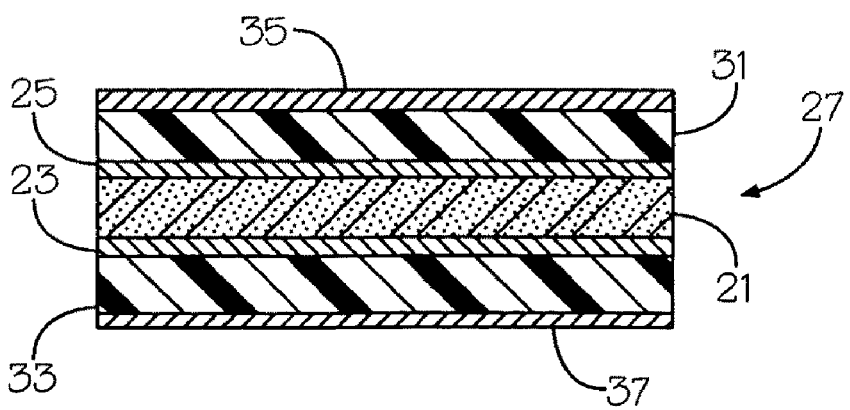
FIG. 3 is a side elevational view, in section and on an enlarged scale, illustrating the initial steps of making a capacitive substrate in accordance with one embodiment of the invention, this substrate utilizing the capacitor of FIG. 2.

FIG. 3 represents some of the initial steps in forming a capacitive substrate according to one embodiment of the invention. In the FIG. 3 structure, layers 31 and 33 of dielectric material are added to opposite sides (top and bottom) of the structure, following which conductor layers 35 and 37 are added. Layers 31 and 33 are preferably applied using conventional PCB lamination processing and equipment. Layers 35 and 37 are preferably also applied using such conventional lamination processing. Further description is not deemed necessary. Unlike the capacitor material 21, the dielectric materials usable for layers 31 and 33 include the aforementioned Fiberglas-reinforced epoxy resin, some referred to as "FR-4" dielectric materials in the art, polytetrafluoroethylene (Teflon), polyimide, polyamide, cyanate resin and photoimageable material. Other dielectric materials usable for layers 31 and 33 include bismaleimide, benzoxazine and halogen-free resin. Such material may be additionally reinforced with discrete ceramic particles added thereto. The conductor layers 35 and 37 are of similar material as layers 23 and 25, this being copper or copper alloy, and are formed from foil sheets of said material. In one embodiment, each dielectric layer may have a thickness of only about two mils, while the corresponding thickness of the outer conductor layer atop same may have a thickness of only about one mil. These are only meant as examples, however, and not intended to limit the invention. Significantly, capacitor 27 is now internally located within the multi-layered structure of FIG. 3.

Figure 2:
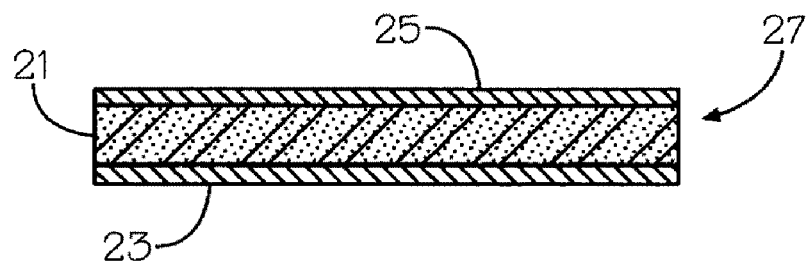

As with the structure of FIG. 2, the seven-layered structure of FIG. 3 may now be subjected to further processing, including the personalizing of each of the outer conductor layers 35 and 37. Such personalizing may be accomplished using the above described photolithographic processing as usable for previous outer conductor layers 23 and 25. Additionally, it may also be desirable to form thru-holes within selected portions of the structure prior to its final assembling to other electrical elements. The embodiment of FIG. 4 represents but one example of such further processing of the FIG. 3 structure, the result being a capacitive substrate 51 including internal capacitor 27 therein, and the shown additional dielectric and conductor layers. The FIG. 3 structure is capable of more modifications than shown in FIG. 4. Specifically, it may be possible to add even more dielectric and conductor layers onto the formed capacitor member 27.

Figure 4:
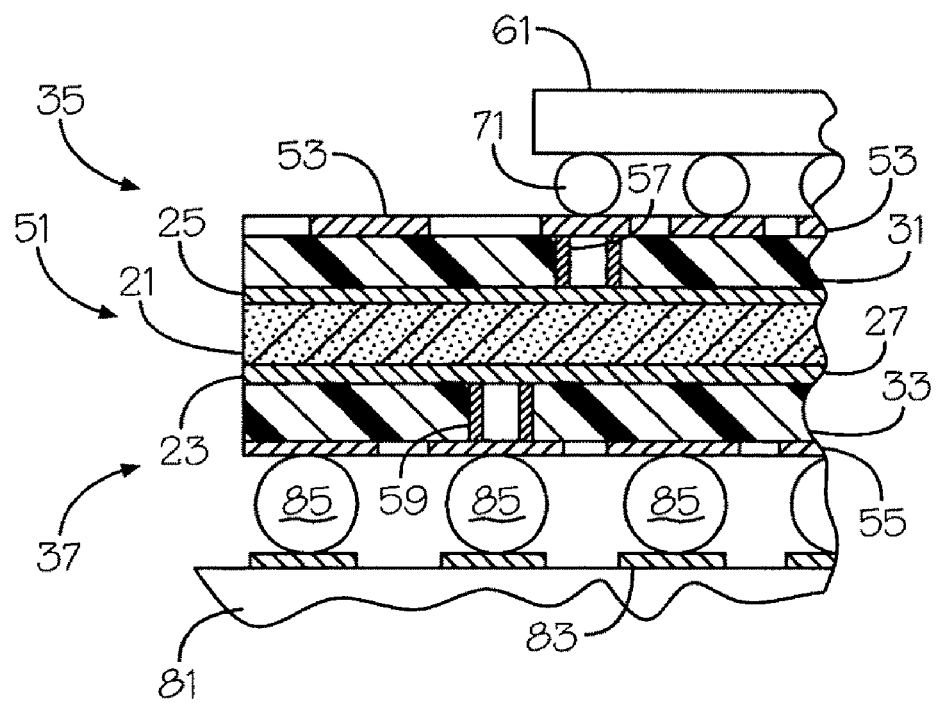
FIG. 4 is a side elevational view, in section and on an enlarged scale, illustrating the capacitive substrate of FIG. 3, after having been subjected to further processing.

In FIG. 4, the outer conductor layers 35 and 37 have been personalized to now include a plurality of individual lines/pads 53 and 55, respectively. Additionally, thru-holes 57 and 59 are formed within layers 31 and 33, respectively. Each hole 57 and 59 is preferably formed by drilling, using a conventional mechanical drill or laser and, following such drilling, each is plated initially with a first thin layer of palladium (as a seed), followed by a thin layer of electro-less copper and finally a thicker layer of electrolytic copper.

In one embodiment, the total thickness of both copper layers combined is 0.5 mils. As is understood, other metallurgies and thicknesses are possible. Significantly, thru-hole 57 serves to electrically couple one of the pads 53 on layer 35 to the interim conductor layer 25. This pad and the adjacent thru-hole 57 are thus part of a circuit connected to layer (and now electrode) 25. Similarly, a selected one of the bottom pads 55 of layer 37 is coupled to the opposite layer (electrode 23) of capacitor 27. This pad 55 and the thru-hole are also part of the circuitry including the capacitor.

In the FIG. 4 embodiment, an electrical component 61 such as a semiconductor chip or even a chip carrier, when positioned atop capacitive substrate 51 and coupled thereto as shown, using a plurality of solder balls 71 of conventional material, is capable of being electrically connected to selected signal, power and/or ground layers which may form part of the capacitive substrate. Component 61 may also be coupled to the internal capacitor 27. Likewise, another electrical structure such as a multi-layered PCB 81 may also have substrate 51 positioned thereon and electrically joined thereto. And further likewise, one or more of the PCB's pads/lines 83 (only one shown in FIG. 4) may be connected to the opposite side of capacitor 27, also using solder balls 85 of conventional solder material. A circuit path is thus formed including this one pad/line 83, the attached solder ball 85, the single pad/line 55, thru-hole 59, capacitor 27, thru-hole 57, single pad 53 and attached solder ball 71, such that component 61 is capacitively coupled to underlying circuit structure (PCB) 81.

Figure 5:
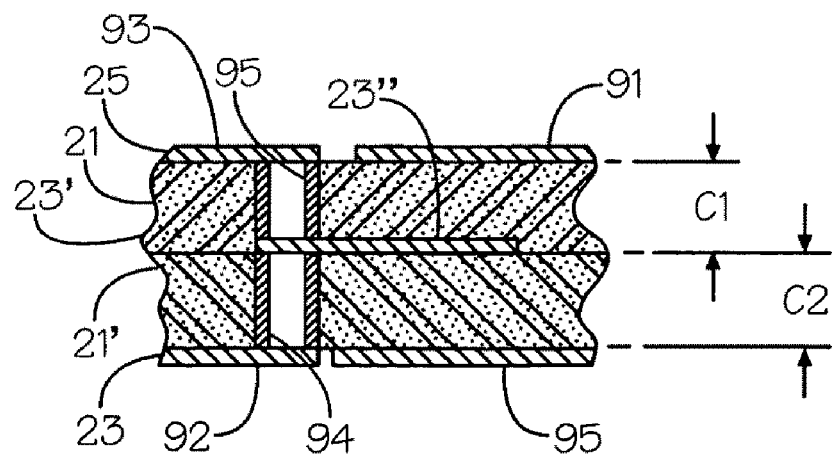
FIG. 5 is a side elevational view, in section and on an enlarged scale over the view of FIG. 3, illustrating an alternative embodiment of a capacitive substrate of the invention.

Although showing only one path including internal capacitor 27, the invention is also capable of having more than one such path by providing conductor member 25 with two isolated pads/lines and a corresponding paid within member 23. In such an example, two of the pads/lines 53 may be coupled to the capacitor 27. Likewise, two of the pads/lines 55 might also be connected to the opposite conductor 23. Two thru-holes would also be used as past of such a dual circuit path. Other combinations are also possible using the teachings herein. The structure of FIG. 5 is adapted for use in many environments, including particularly as part of an information handling system. Such a final system may include more than one such PCB 81, substrates 51 and components 61.

FIG. 5 depicts the formation of at least two capacitors C1 and C2 within a single capacitive substrate structure. The structure in FIG. 5 may be similar to that in the above FIGS. 3 and 4, with the addition of a second layer 21' of capacitor material, and the provision of an interim conductor layer 23' (shown by way of example as a single conductor 23").

Layer 21' may be formed onto layer 23' similarly as was layer 21 onto layer 23 in FIG. 1. Formation of a single conductor 23" may then be formed by conventional procedures, including the aforementioned photolithographic processing.

These capacitors may have similar or different values, again illustrating the versatility of the invention. In one example, C1 may have a value of 1 nF/inch$^2$ (nano-Farads per square inch), while C2 may possess a larger value of 100 nF/inch$^2$. Capacitor C1 is shown to comprise common electrode 23" and electrode 91 (conductor 23" in turn a part of a circuit including opposing conductors 92 and 93 due to connections via thru-holes 94 and 95, respectively, it being understood that one of said conductors may be eliminated, as may be the associated thru-hole). Capacitor C2 in turn comprises common electrode 23" and electrode 95. Each electrode 91 and 95 may in turn be coupled to external components such as component 61 and PCB 81. Understandably, many different combinations of electrodes may be utilized to form two capacitors and the invention is not limited to the specific example shown. Moreover, the invention is not limited to one or two internal capacitors for a capacitive substrate; it is within the scope of the invention to provide many more, if operational requirements dictate. As with the substrate of FIG. 4, several additional conductor and dielectric layers may also be added, and preferably are, to the FIG. 5 embodiment. The following Table 1 represents examples of possible additional values for the paired capacitor embodiment of FIG. 5.

According to the teachings of the instant invention, it is possible to vary the capacitance values of the capacitors formed by varying the thicknesses of the capacitance dielectric materials and/or the materials themselves. Core materials consist of laser drillable dielectric materials (e.g., Thermount), polymer nanocomposite based flake-free resin coated copper, and resistor foil or printable capacitors and resistors with variable sheet resistance.

A variety of laser drillable dielectric materials have been used, such as resin impregnated porous paper, resin impregnated paper/Thermount containing arromad fiber, polymer composite containing micro filler (10 wt %-90 wt %) with average filler diameter 10 micron or less, polymer nanocomposite containing nano filler (10 wt %-90 wt %) with average filler diameter 0.1 micron or less, polymer composite containing submicron filler (10 wt %-90 wt %) with average filler diameter between 0.11-0.99 micron or their combination. Laser drillable multilayer dielectric can be used, such as resin impregnated Thermount in the middle layer and pure resin outside or resin impregnated Thermount in the middle layer and polymer nano/sub-micro/micro composite outside. It is also possible to use organic-inorganic hybrids as laser drillable dielectric. Laser drillable multilayer dielectric can be used, such as thermoplastic resin in the middle layer and thermoset resin as the external layer or thermoset resin in the middle layer and thermoplastic resin as the external layer, or multiple thermoplastic resin or multiple thermoset resin or their combination. Moreover, liquid crystal polymer or a combination of high and low melting liquid crystal polymer (LCP) can be used. Finally, pure polymer or polymer blend can be used as laser drillable dielectric materials.

The Examples cited below represent various materials which can be used, and Table 2 represents the various capacitance values when using alternative thicknesses and materials. The capacitor material thickness dimensions in FIG. 5 are for illustration purposes only and may be adjusted as needed. The substrate manufacturer can meet the operational requirements of many circuit designs simply by providing different capacitance dielectric materials and/or modifying the thicknesses thereof. A further significant aspect of the invention is that the capacitors formed may be connected to each other with the plated thru-holes and/or circuit features on the conductor layers. These connections can be either series or parallel connections. Thus, with the various electrode sizes, dielectric materials and thicknesses, an infinite number of capacitor values can be achieved in a single substrate.

TABLE 1

Two capacitors connected as shown in FIG. 5.

| Capacitors | Capacitance Density (nF/inch$^2$) | (0.1" × 0.1") Capacitor (pF) | Total capacitor through series connection (1/C = 1/C1 + 1/C2) | Total capacitor through parallel connection (C = C1 + C2) |
|---|---|---|---|---|
| C1 | 1 nF/inch$^2$ | 10 | 9.9 pF | 1010 pF |
| C2 | 100 F/inch$^2$ | 1000 | | |

TABLE 2

Materials with different composition, thickness and capacitance density and thickness.

| Materials/Particle size | Thickness (microns) | Capacitance Density (nF/inch$^2$) |
|---|---|---|
| BaTiO$_3$ (mean particle size 0.12 micron), Epoxy Novolac Resin and high molecular weight Phenoxy Resin - the BaTiO$_3$ comprising about 77 percent by weight. | 2.0 microns | 80 nF/inch$^2$ |
| BaTiO$_3$ (mean particle size 0.12 micron), Epoxy Novolac Resin and high molecular weight Phenoxy Resin - the BaTiO$_3$ comprising about 73 percent by weight. | 25 microns | 3 nF/inch$^2$ |

The following Examples represent various combinations of capacitor dielectric materials and processes used to form capacitors according to various aspects of the invention. These are understood to be examples only and not limiting of the scope of this invention.

Example One 38.5 grams (gm) of epoxy novolac resin (e.g., one sold under product designation "LZ 8213" by Huntsman) containing about 35 percent by weight methyl ethyl ketone, and catalyzed with about 0.015 parts per hundred (PPH) of 2-methyl-imidazole and 12.8 gm of a high molecular weight, reactive thermoplastic phenoxy resin (e.g., the aforementioned one sold under the product name "PKHS-40" by the InChem Corporation) containing 60 percent by weight methyl ethyl ketone, were mixed together with 100 gm of barium titanate (BaTiO$_3$) powder (available from Cabot Corporation, having a business location in Boyertown, Pa.). The barium titanate powder included a mean particle size of 0.12 microns and a surface area of 8.2 m$^2$/gm. Also mixed in with this composition was 20 gm of methyl ethyl ketone. The composition was ball milled for one day, after which a thin coating of this well dispersed composition was wire-rod coated on a copper substrate (a copper foil) and dried at about 130 degrees C. for three minutes in a standard convection oven. This heating served to substantially remove all residual organic solvents. Following removal and cooling to room temperature, the coating exhibited substantially no flaking. The resulting capacitance density of the formed capacitor measured about twenty nano-Farads (nF)/square inch, with a dielectric loss of only about 0.02 at 1 Mega-Hertz (MHz). The measured coating thickness was about eight microns. Significantly, the barium titanate in this example comprised less than eighty percent by weight of the final layer material.

Example Two 50 gm of epoxy novolac resin (e.g., the "LZ 8213" above by Huntsman) containing about 35 percent by weight methyl ethyl ketone and catalyzed with about 0.015 PPH of 2-methyl-imidazole, and 19.2 gm of the high molecular weight, reactive thermoplastic phenoxy resin "PKHS-40" (containing 60 percent by weight methyl ethyl ketone), were mixed together with 111 gm of barium titanate (BaTiO$_3$) powder from Cabot Corporation having the same mean particle size and surface area as in Example One (0.12 microns and 8.2 m²/gm, respectively). Also mixed in with this composition was 20 gm of methyl ethyl ketone. As also in Example One, the composition was ball milled for one day, after which a thin coating of this mixed composition was deposited on a copper substrate (a copper foil) and dried at about 130 degrees C. for three minutes in a standard convection oven. This heating also served to substantially remove all residual organic solvents. Following removal and cooling to room temperature, the coating exhibited substantially no flaking. The resulting capacitance density of the formed capacitor measured about three nano-Farads (nF)/square inch, with a dielectric loss of only about 0.02 at 1 Mega-Hertz (MHz). The measured coating thickness was about twenty-five microns. As in Example One, the barium titanate in this example comprised less than eighty percent by weight of the final layer material.

Thus there has been shown and described a capacitive substrate formed by using a capacitor material which exhibits substantially no flaking prior to its incorporation as part of the substrate (e.g., lamination thereof with other elements of the structure). Two or more capacitors may be formed as part of the capacitive substrate, as explained and illustrated herein. Importantly, the substrate may be formed using many conventional PCB processes to thereby reduce costs associated with production thereof. This capacitive substrate may also be incorporated into a larger, multi-layered structure if desired, including one with more capacitive substrates as part thereof. Such incorporation is possible also using conventional PCB processing, in this case simple lamination at established pressures and temperatures. There have also been defined examples of capacitor materials which may be used. The invention as defined herein, if desired, is capable of transmitting both regular and high speed signals, the latter at a rate of from about one Gigabit/sec to about ten Gigabits/second and even higher, while substantially preventing impedance disruption. Of further significance, the invention is able to utilize thru-holes of very fine definition and is able to assure highly dense circuit patterns, all of which are deemed extremely important to many of today's products using such substrates.

The invention contemplates the multi-layer embedded capacitance and resistance layers having the same copper layer used as an electrode of one of the individual capacitors. In some cases the resistor and capacitor electrode can be shared. It is possible to make two more resistance layers than capacitance layers. In one embodiment, for example, four resistance layers and two capacitance layers are constructed. Layers can be parallel or series connected to achieve variable capacitance and resistance. Additional capacitance layers can be added to achieve the desired level of capacitance. The structure can then add built-up dielectrics as needed to complete the substrate or printed wiring board.

Figure 6:
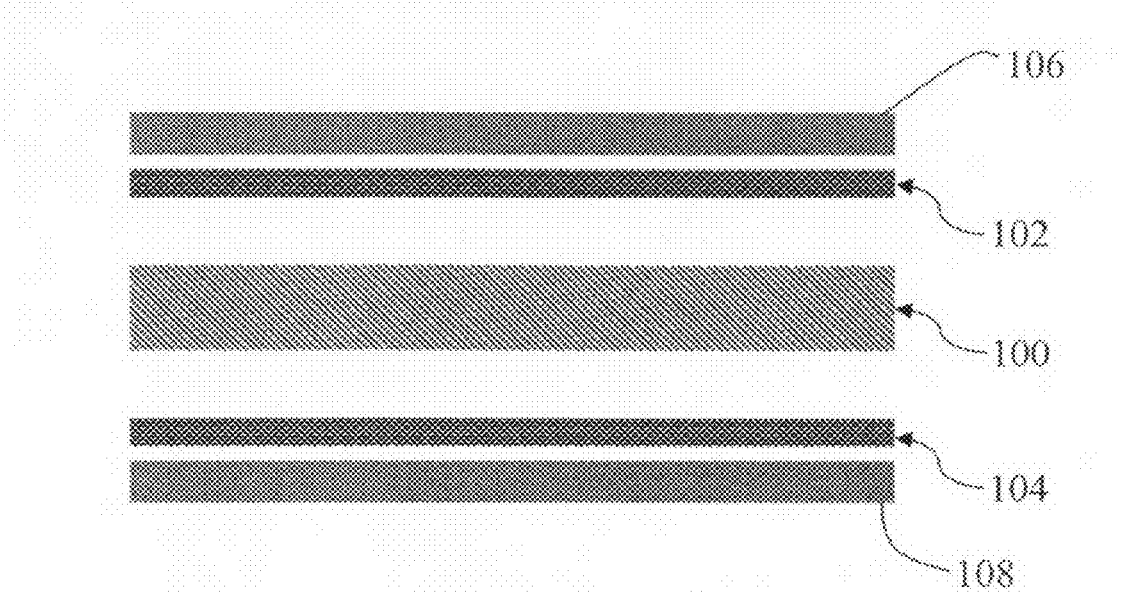
FIGS. 6-20 are schematic representations of the process steps in accordance with the present invention.
Figure 7:
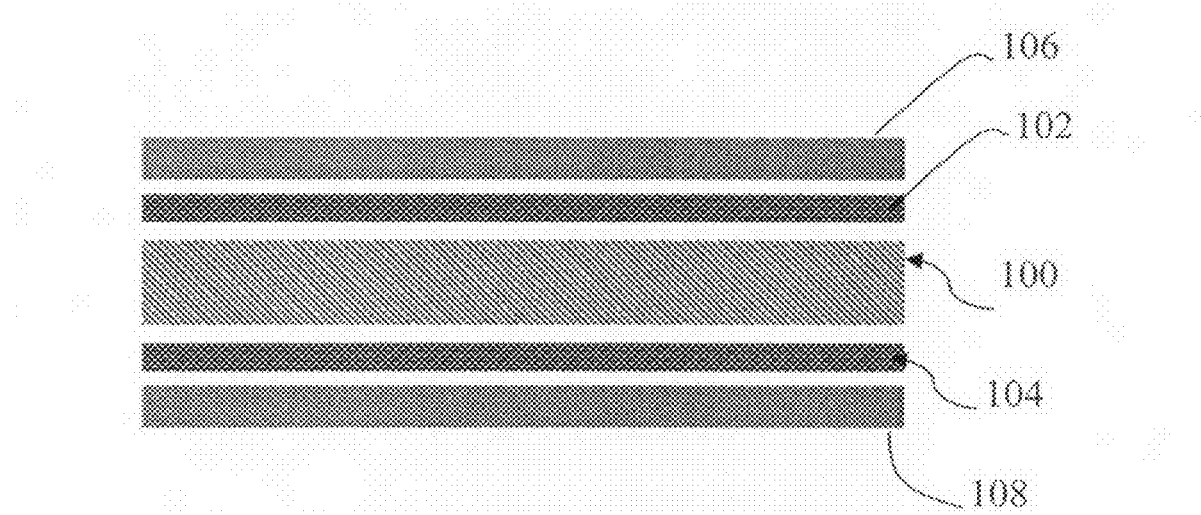
Figure 8:
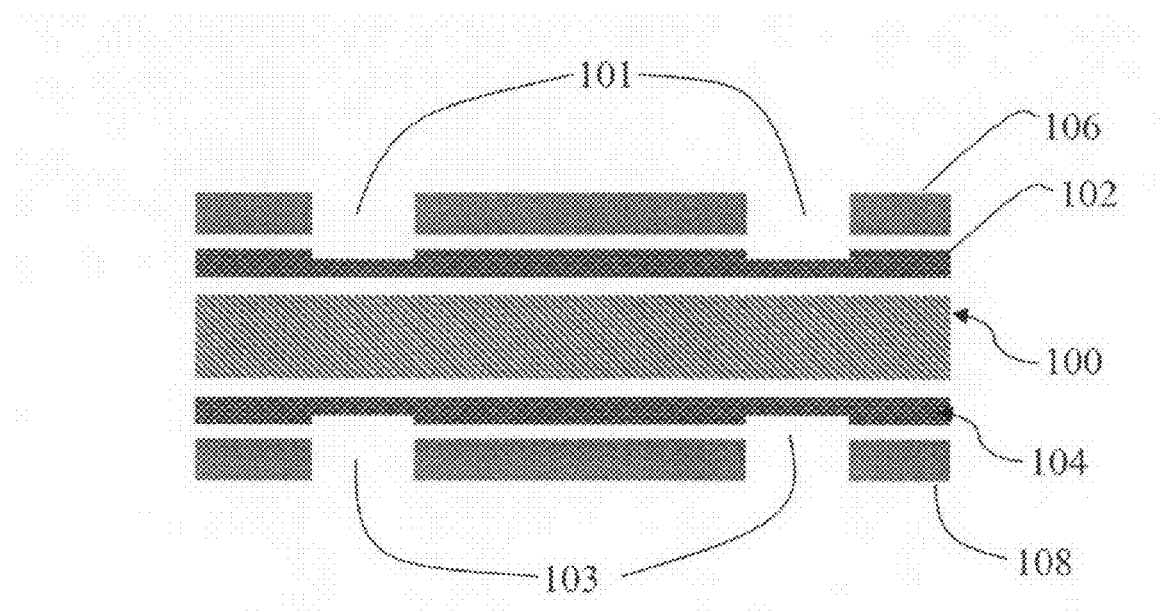

Referring now to FIGS. 6-20, there are shown process steps in producing the multi-layer embedded capacitance and resistance substrate core in accordance with the present invention. A laser drillable dielectric 100 is first provided (FIG. 6). Resistance layers 102, 104 are deposited on either side (upper or lower) of dielectric 100. Copper foil 106, 108 is applied to resistance layers 102, 104, respectively. The aforementioned layers 102, 104, 106, 108 are then laminated to dielectric 100, resulting in the structure shown in FIG. 7. In these embodiments, layers 102, 104 may possess a thickness of from few Angstrom (Å) to about 4 mils (a mil being one-thousandths of an inch) while conductor 106, 108 may include a thickness of from about 0.2 mils to about 2.5 mils. Conductors 106, 108 form part of a circuit for the invention.

Resist is applied to the structure and developed, as is well known in the art of printed circuit board manufacturing. Copper layers 106, 108 and resistance layers 102, 104 are etched with a cupric etchant to generate openings 101 and 103. The resist is then stripped, resulting in the structure shown in FIG. 8.

The resist is again applied and developed and copper is selectively etched with ammoniacal etchant. The resist is stripped, resulting in the structure shown in FIG. 9. Selective copper etching exposes resistance materials and generates openings 105 and 107. Etched copper 106' with opening 105 on resistance material will act as an individual resistor where etched copper pair 106' acts as an electrode for individual resistors.

Figure 9:
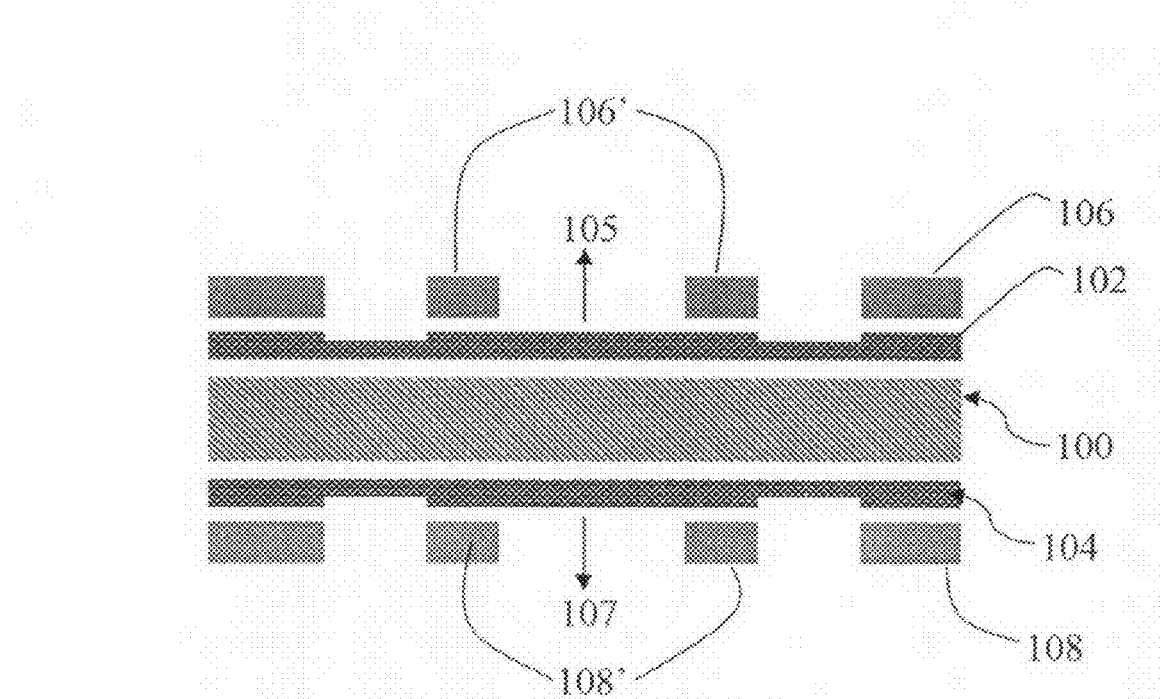
Figure 10:
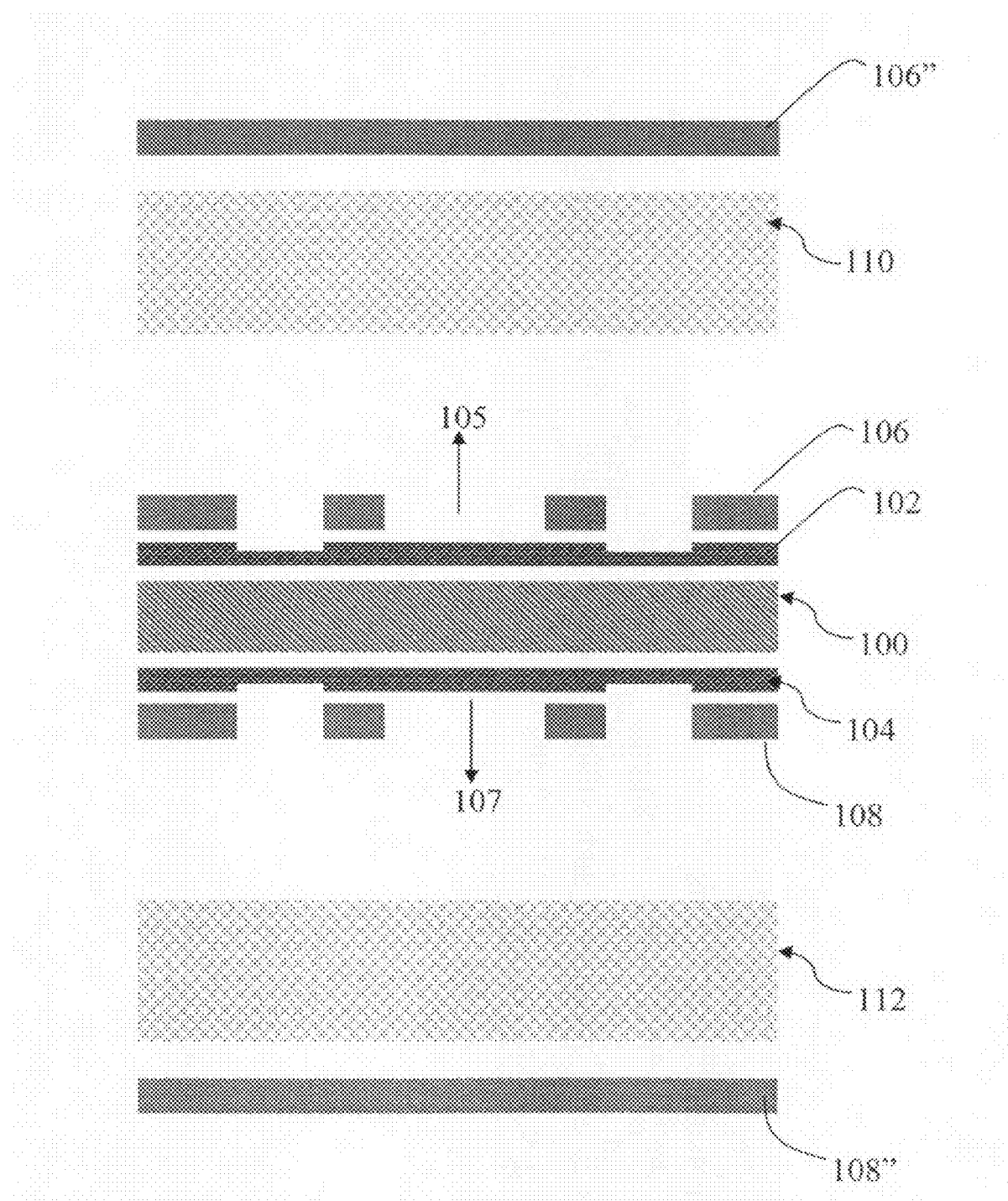
Figure 11:
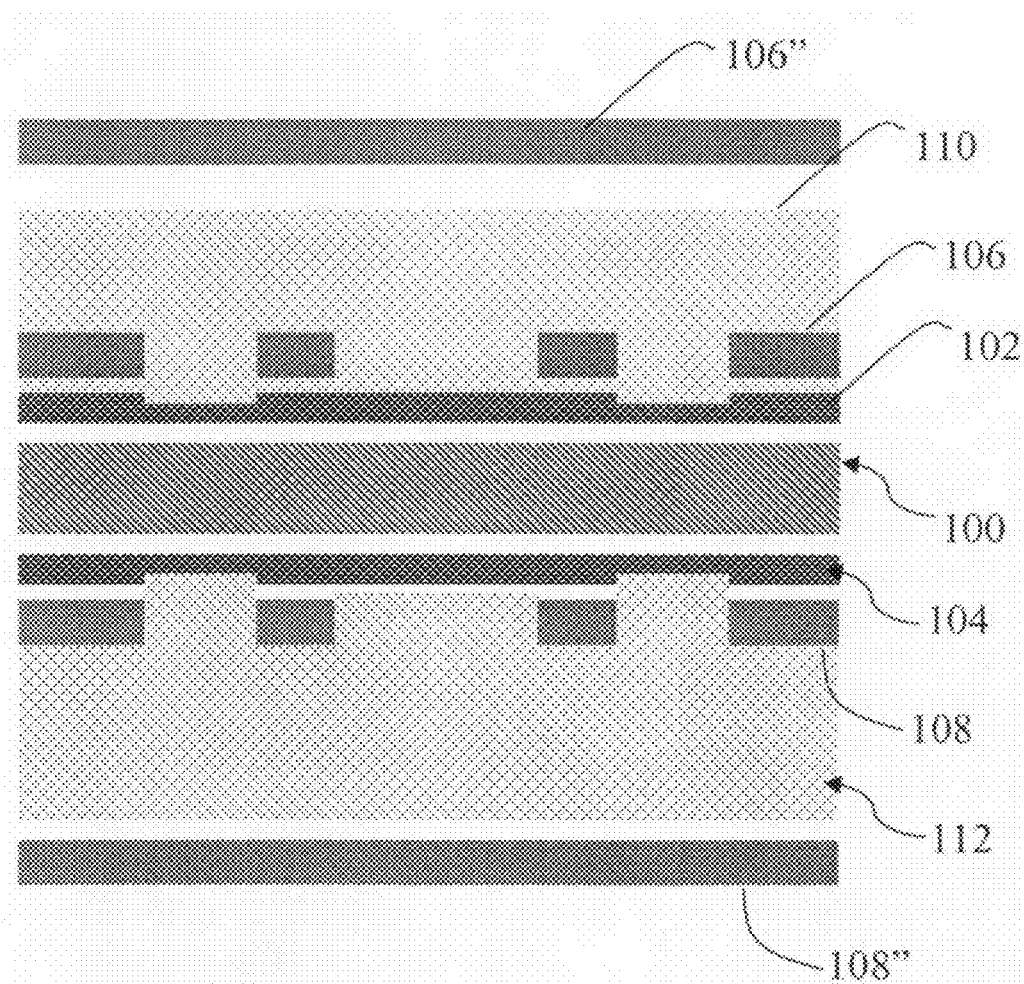

Copper coated capacitance layers 110, 112 are then positioned above and below the structure, respectively, as shown in FIG. 10. The new structure is then laminated and the empty copper spaces 101, 103, 105, 107 are filled with capacitance materials, as shown in FIG. 11. The layer of capacitance material 110, 112 is bonded with external Cu 106" and 108". A further significant aspect of the invention is that the formed capacitance layer may be screen printed directly (FIG. 9.) A layer of capacitance material can be screened through a mesh screen onto the surface of a core (FIG. 9). This capacitance layer can be cured at approximately 150° C. for about two hours, followed by an additional cure at approximately 190° C. for about one hour. The second electrical conductor may be formed using a sputtering operation followed by a copper electroplating process and a photolithographic etch step. Furthermore, screen printing provides multiple capacitance density material deposition in the same layer resulting in a variable capacitance density layer.

Figure 12:
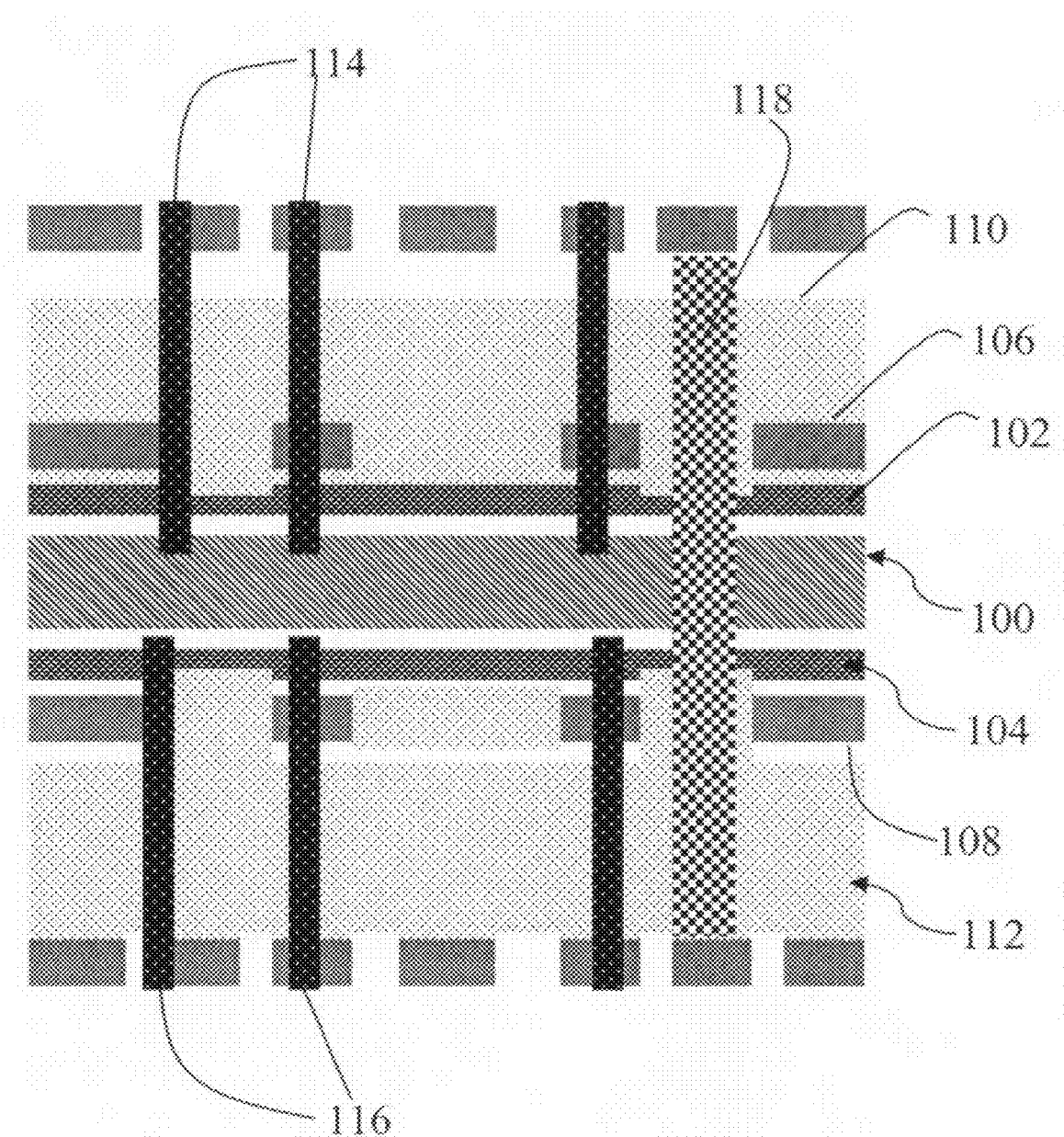
Figure 13:
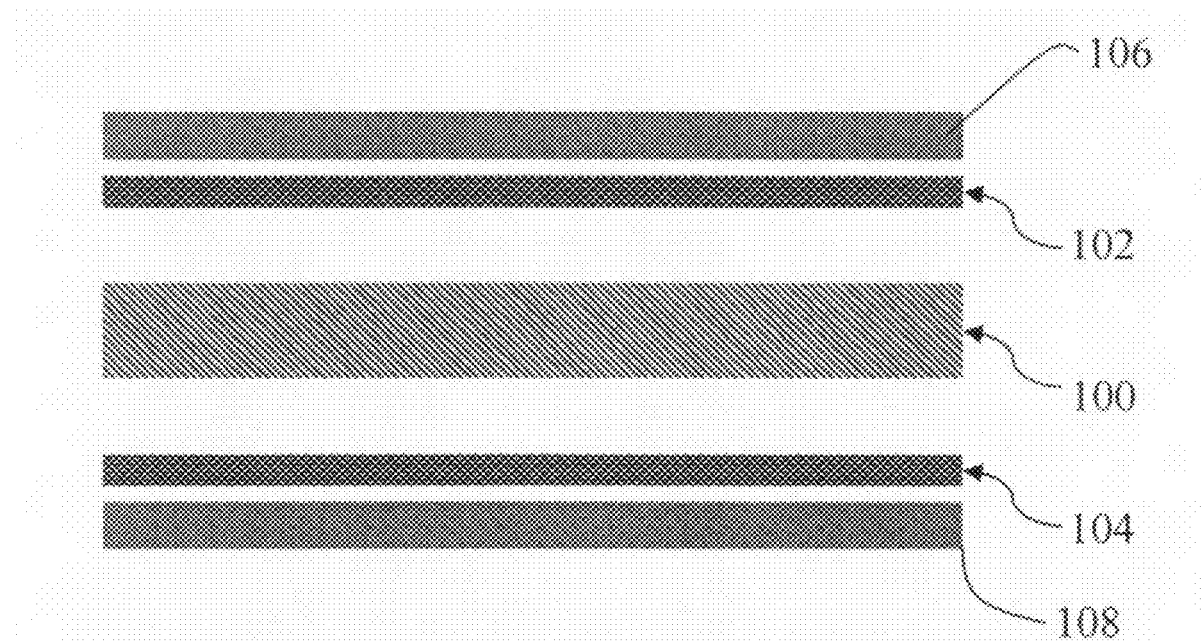
Figure 14:
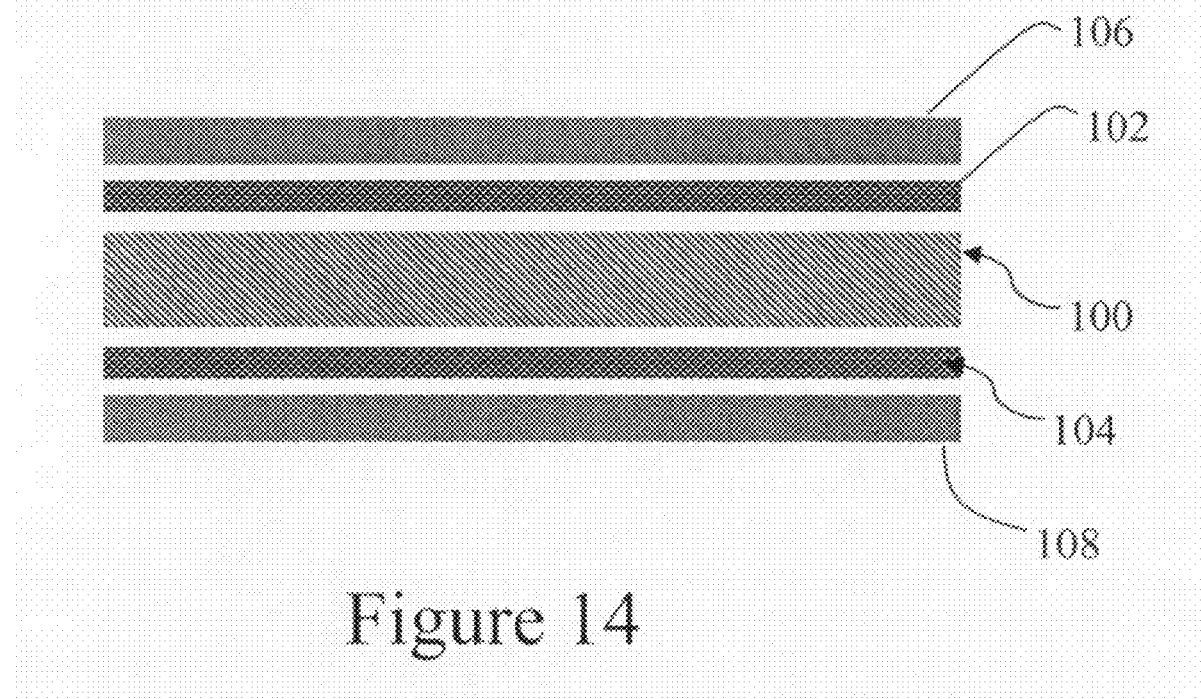
Figure 15:
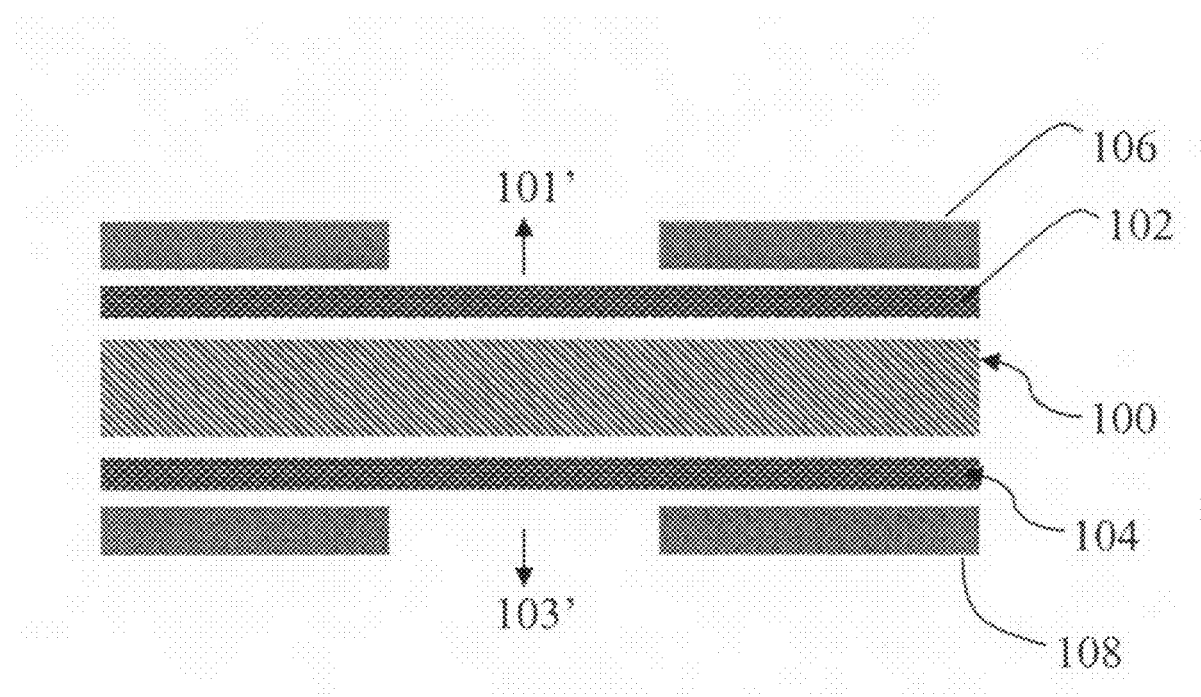
Figure 16:
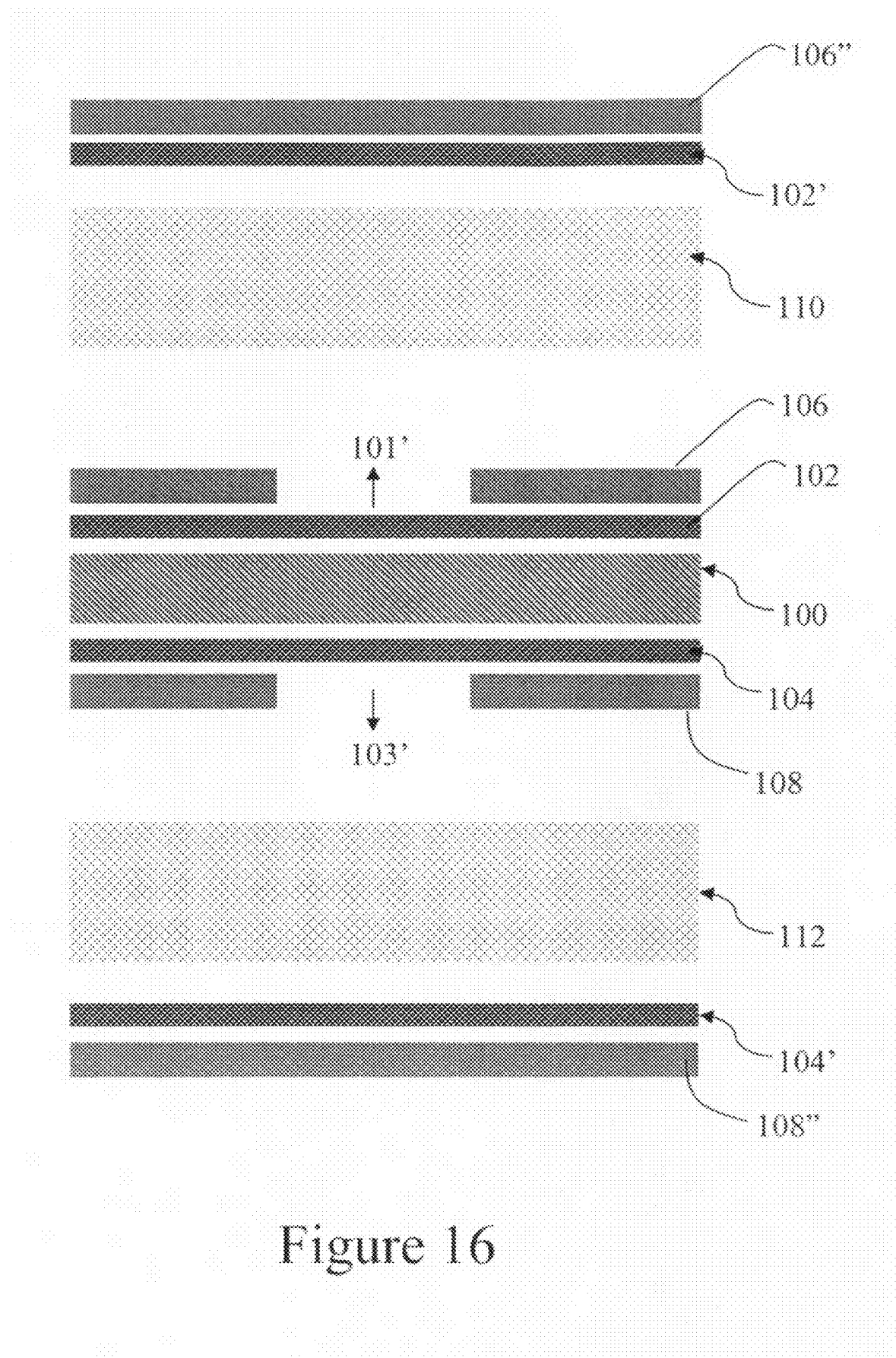

Resist is again applied and developed, and then etched and stripped. Micro-via 114, 116 and thru via 118 connections are then created, as shown in FIG. 12. Note that the resistance and capacitance layers include the same copper layer, which is used as one of the individual capacitor and resistor electrodes. It is also possible to create two more resistance layers than the number of capacitance layers, as shown with respect to FIGS. 13-20. As aforementioned, once laser drillable dielectric is provided and respective resistance layers and copper foil layers are disposed on both sides thereof, the structure is laminated, resulting in the FIG. 14 schematic. The resist is applied and developed and selective copper etching is performed with ammoniacal etchant. The resist is then stripped, forming the structure shown in FIG. 15. Again, selective copper etching exposes resistor materials and generates openings 101' and 103'.

Figure 17:
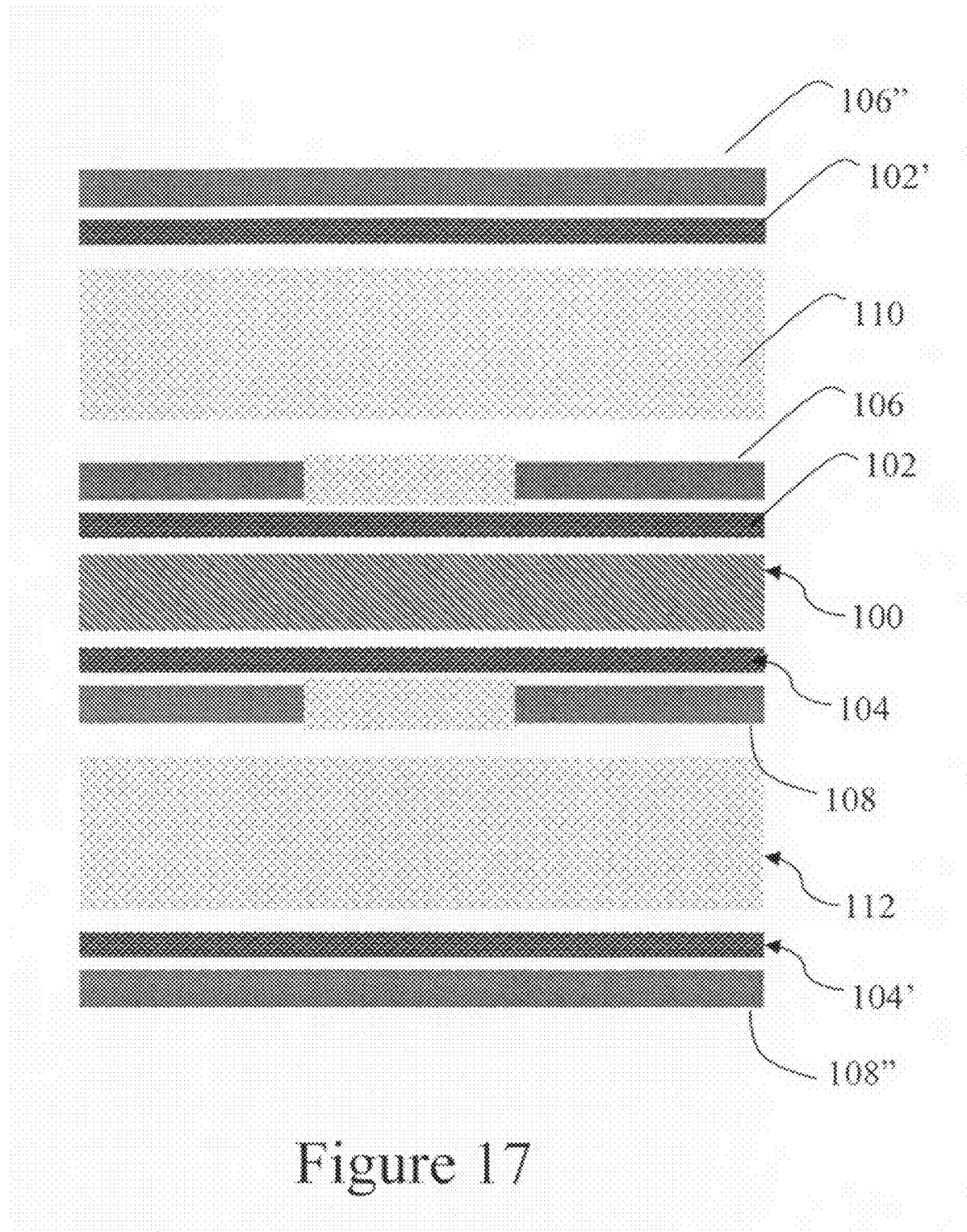
Figure 18:
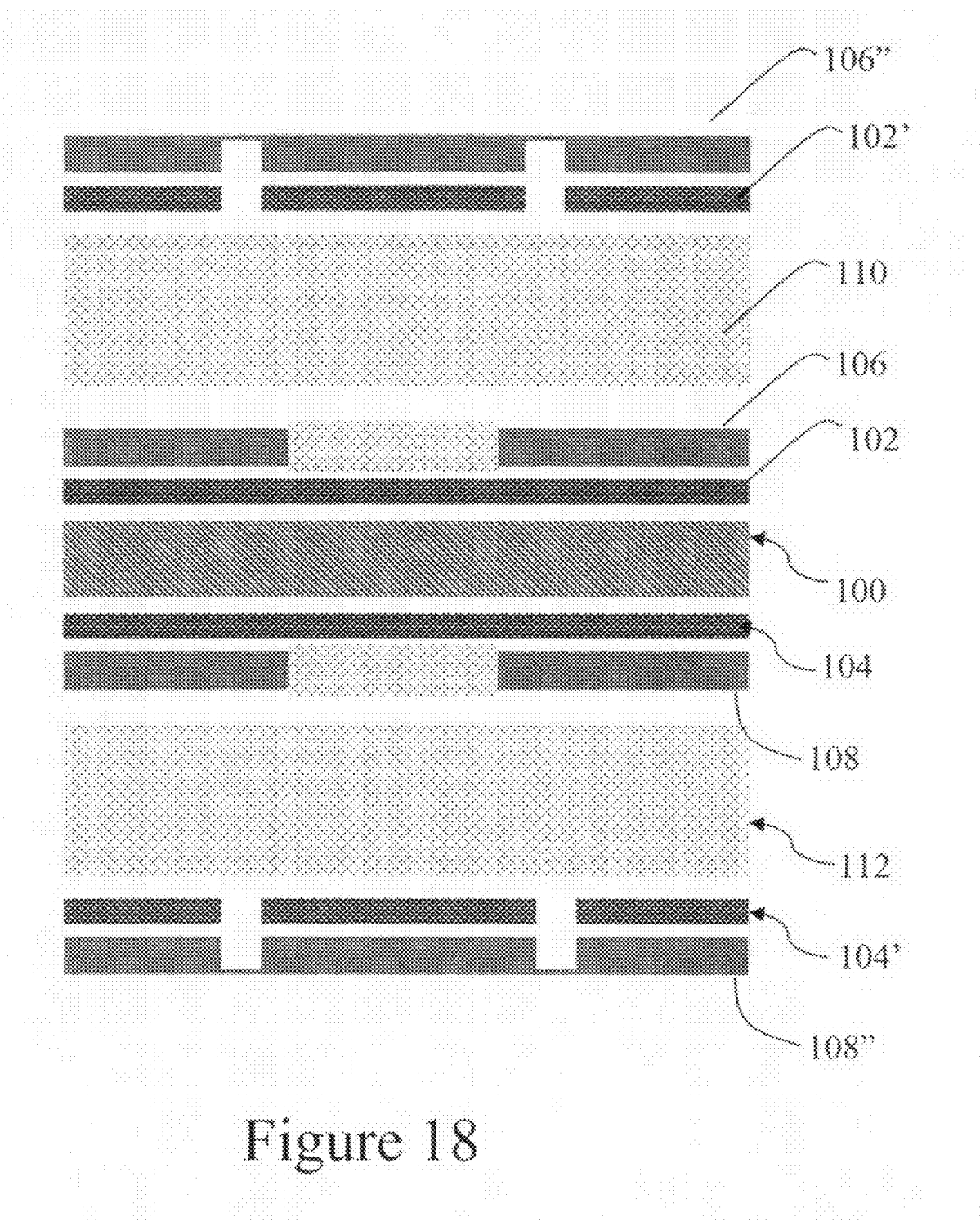

Copper 106", 108" and resistance material 102', 104' and coated capacitance layers 110, 112 are provided (FIG. 16), followed by lamination as shown in FIG. 17, wherein empty copper spaces 101', 103' are filled by capacitance materials. Once again, resist is applied and developed and copper etching is selectively performed with ammoniacal etchant. The resist is then stripped, resulting in the structure shown in FIG. 19. In these embodiments, layers 102', 104' may possess a thickness of from a few Angstroms to about a few microns while conductor 106", 108" may include a thickness of from about 0.2 mils to about 2.5 mils. Conductors 106", 108" form part of a circuit for the invention.

Figure 19:
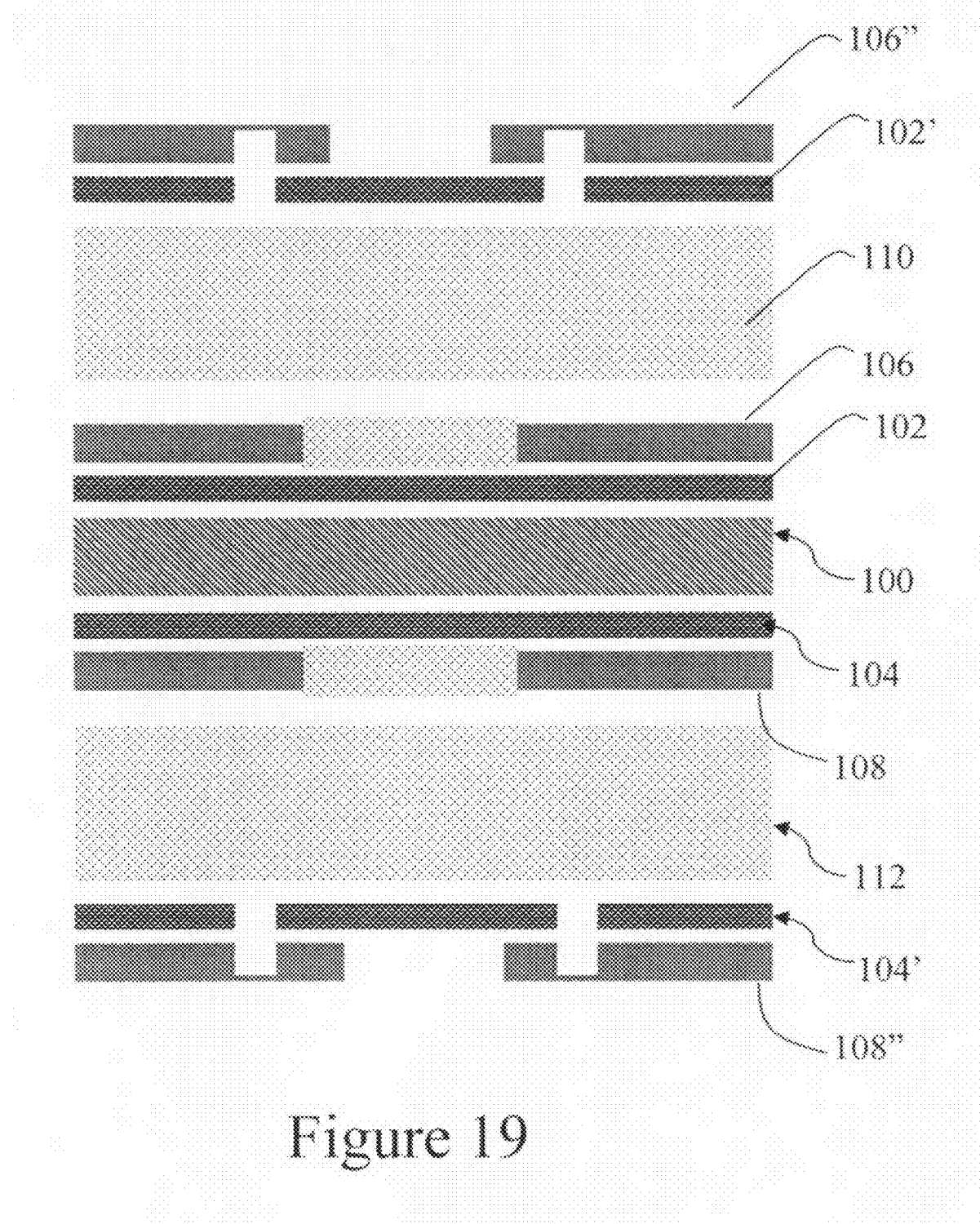
Figure 20:
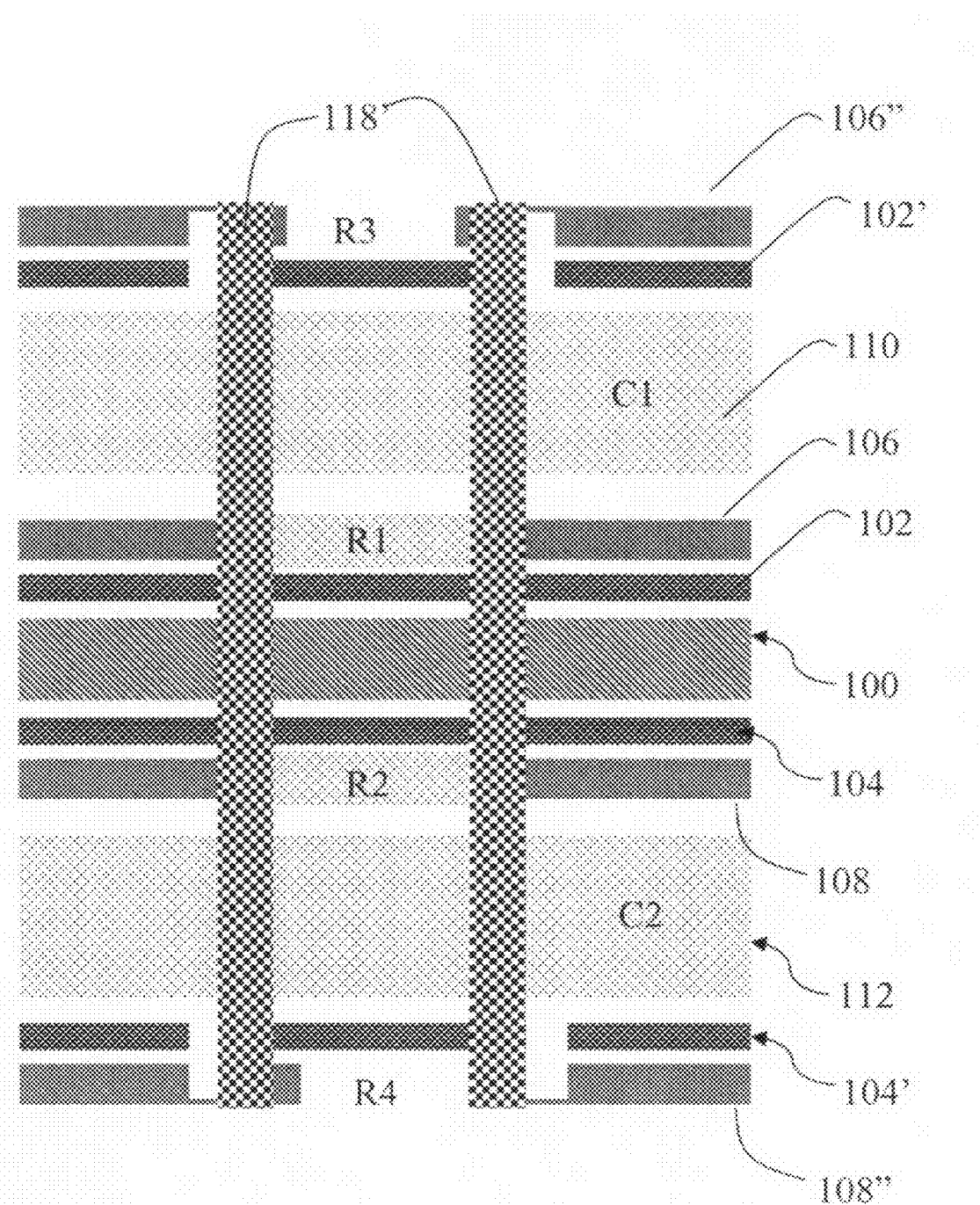

FIG. 20 shows a typical substrate structure with embedded resistors and capacitors. It can be seen that additional capacitance and resistance layers can be embedded in a substrate to achieve a desired level of capacitance and resistance. The built up dielectric layers are added to the upper and lower portions of the substrate, as needed to complete the substrate. The left portion of FIG. 20 depicts a schematic view of a typical set of via structures of the substrate. FIG. 19 shows four layers of resistance materials and two layers of capacitance materials. The four layers of resistance material can produce many individual resistors. In FIG. 20, at least four individual resistors R1, R2, R3 and R4 are generated from four different resistance layers.

Similarly two capacitance layers can produce many individual capacitors. In FIG. 20, at least two capacitors C1, C2 are generated from two capacitance layers. Through via 118' has parallel connection among the four resistor electrodes and through via 118' has a parallel connection for capacitor electrodes 106, 108 to double the overall capacitance (C1+C2).

Since other modifications and changes varied to fit particular operating requirements and environments will be apparent to those skilled in the art, the invention is not considered limited to the examples chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A multi-layer embedded capacitance and resistance substrate core, comprising:
   a) at least one layer of resistance material on a laser drillable dielectric, said one layer of resistance material having a patterned layer of electrically conductive material embedded therein;
   b) a first patterned electrically conductive layer disposed on said first patterned resistance layer;
   c) a capacitance layer disposed on said first patterned electrically conductive layer, said capacitance layer having non-uniform thickness;
   d) a second resistance layer disposed on said capacitance layer; and a second electrically conductive layer disposed on said second resistance layer; and
   e) a plurality of thru-holes formed by laser.

2. The multi-layer embedded capacitance and resistance substrate core in accordance with claim 1, wherein said laser drillable dielectric material has a layer of resistance and capacitance material on both sides thereof.

3. The multi-layer embedded capacitance and resistance substrate core in accordance with claim 1, wherein said at least one layer of capacitance material comprises a plurality of capacitance layers having variable capacitance density.

4. The multi-layer embedded capacitance and resistance substrate core in accordance with claim 1, wherein said laser dielectric material has controlled CTE ranging from approximately 7-15 ppm.

5. The multi-layer embedded capacitance and resistance substrate core in accordance with claim 1, wherein said conductive layer bonded to said capacitance layer comprises a layer of resistance material comprising a layer of electrically conductive material therein.

6. The multi-layer embedded capacitance and resistance substrate core in accordance with claim 1, further comprising:
   e) at least one other layer of capacitance material partially covering said substrate core, whereby a capacitance at a first predetermined position relative to said substrate is different from the capacitance at a second predetermined position relative to said substrate.

7. The multi-layer embedded capacitance and resistance substrate core in accordance with claim 1, further comprising:
   e) at least one other layer of resistance material partially covering said substrate core, whereby a resistance at a first predetermined position relative to said substrate is different from the resistance at a second predetermined position relative to said substrate.

8. The multi-layer embedded capacitance and resistance substrate core in accordance with claim 6, further comprising:
   f) at least one other layer of resistance material partially covering said substrate core, whereby a resistance at a first predetermined position relative to said substrate is different from the resistance at a second predetermined position relative to said substrate and whereby a capacitance at a third predetermined position relative to said substrate is different from the capacitance at a fourth predetermined position relative to said substrate.

9. An information handling system comprising a multi-layer embedded capacitance and resistance substrate core, said core comprising:
   a) at least one layer of resistance material;
   b) a first patterned electrically conductive layer disposed on said first patterned resistance layer;
   c) a capacitance layer disposed on said first patterned electrically conductive layer, said capacitance layer having non-uniform thickness;
   d) a second resistance layer disposed on said capacitance layer; and
   e) a second electrically conductive layer disposed on said second resistance layer;
   f) a plurality of thru-holes formed by laser.

10. The information handling system of claim 9 wherein said at least one layer of resistance material comprises dielectric material.

11. The information handling system of claim 9 wherein said at least one layer of capacitance material comprises a plurality of capacitance layers having variable capacitance density.

12. The information handling system of claim 10 wherein said at least one layer of capacitance material comprises a plurality of capacitance layers each having a different capacitance density.

13. The information handling system of claim 9 wherein the number of said layers of resistance material is greater than the number of said layer(s) of capacitance material by two.

14. A multi-layer embedded capacitance and resistance substrate core, comprising:
   b) a first laser-drillable dielectric layer;
   c) a first patterned resistance layer disposed on said first dielectric layer;
   d) a first patterned electrically conductive layer disposed on said first patterned resistance layer;
   e) a capacitance layer disposed on said first patterned electrically conductive layer;
   f) a second resistance layer disposed on said capacitance layer; and
   g) a second electrically conductive layer disposed on said second resistance layer;
whereby a crenellated capacitance layer is formed between said first laser-drillable dielectric layer and said second electrically conductive layer.

* * * * *